United States Patent [19]

Shimada et al.

[11] Patent Number: 5,506,798

[45] Date of Patent: Apr. 9, 1996

[54] DIGITAL FILTER AND OVERSAMPLING ANALOG TO DIGITAL CONVERTER EMPLOYING THE SAME

[75] Inventors: Katsuyoshi Shimada; Takeshi Kikuchi, both of Hino, Japan

[73] Assignee: Fujifacom Corporation, Tokyo, Japan

[21] Appl. No.: 312,195

[22] Filed: Sep. 26, 1994

[30] Foreign Application Priority Data

Dec. 28, 1993 [JP] Japan .................................. 5-338575

[51] Int. Cl.$^6$ .................................................. G06F 15/31
[52] U.S. Cl. ............................ 364/724.12; 364/724.1; 364/724.13
[58] Field of Search ........................... 364/724.1, 724.12, 364/724.13

[56] References Cited

U.S. PATENT DOCUMENTS

| | | | |
|---|---|---|---|
| 4,701,874 | 10/1987 | Akai et al. | 364/724.13 |
| 4,766,561 | 8/1988 | Thompson et al. | 364/724.13 |
| 4,802,111 | 1/1989 | Barkan et al. | 364/724.13 |
| 5,001,661 | 3/1991 | Corleto et al. | 364/724.12 |

*Primary Examiner*—Tan V. Mai
*Attorney, Agent, or Firm*—Nikaido, Marmelstein, Murray & Oram

[57] ABSTRACT

A digital filter has a cut-off frequency which can be varied by a simple control circuit. The digital filter includes a tap coefficient setting section and a convolution calculation section. The convolution calculation section is constructed so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently. The digital filter can be applied to an oversampling analog to digital converter.

11 Claims, 34 Drawing Sheets

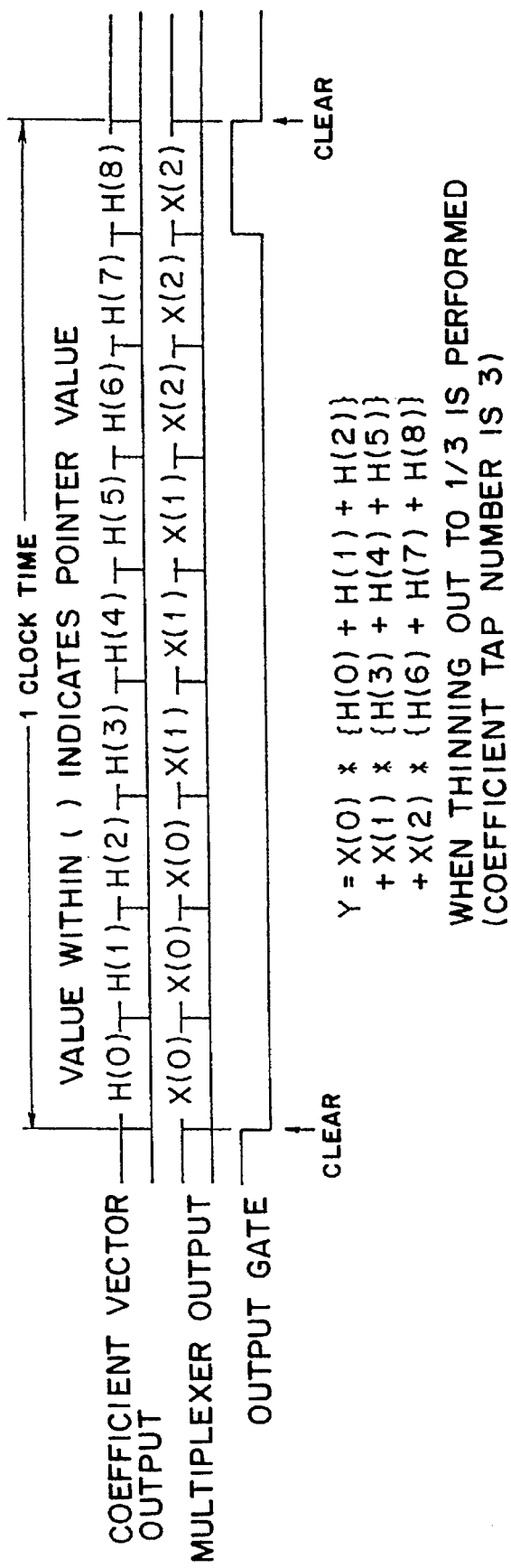

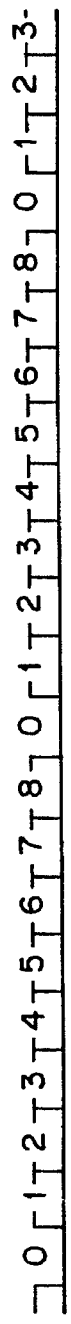
FIG. 16(a) CLOCK
FIG. 16(b) P0
FIG. 16(c) CARRY 0
FIG. 16(d) P1
FIG. 16(e) P2
FIG. 16(f) CARRY 2
WHEN THINNING OUT TO 1/2 IS PERFORMED
(THINNING OUT NUMBER = 2, COEFFICIENT NUMBER = 9)

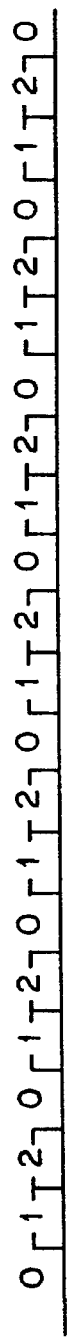
FIG. 17(a) CLOCK
FIG. 17(b) P0
FIG. 17(c) CARRY 0
FIG. 17(d) P1
FIG. 17(e) P2
FIG. 17(f) CARRY 2
WHEN THINNING OUT TO 1/3 IS PERFORMED
(THINNING OUT NUMBER = 3, COEFFICIENT NUMBER = 9)

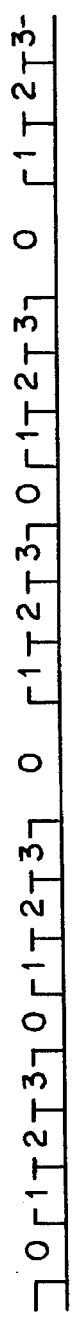
FIG. 18(a) CLOCK
FIG. 18(b) P0
FIG. 18(c) CARRY 0
FIG. 18(d) P1
FIG. 18(e) P2
FIG. 18(f) CARRY 2
WHEN THINNING OUT 1/4 IS PERFORMED
(THINNING OUT NUMBER = 4, COEFFICIENT NUMBER = 9)

FIG. 19(a)
ORIGINAL FILTER CHARACTERISTIC

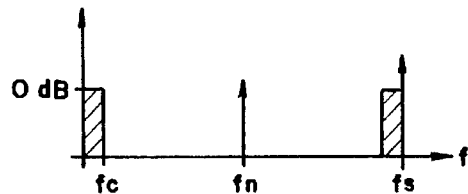

FIG. 19(b)
FILTER CHARACTERISTIC FOR THINNING OUT OF COEFFICIENT VECTORS TO 1/2

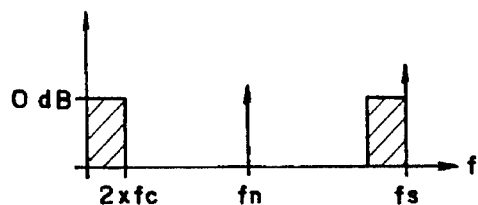

FIG. 19(c)
FILTER CHARACTERISTIC FOR THINNING OUT OF COEFFICIENT VECTORS TO 1/3

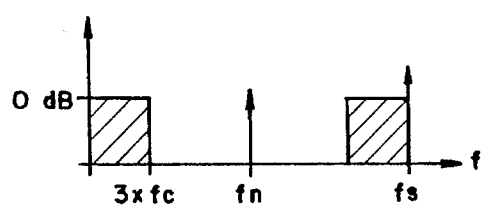

FIG. 19(d)
FILTER CHARACTERISTIC FOR THINNING OUT OF COEFFICIENT VECTORS TO 1/4

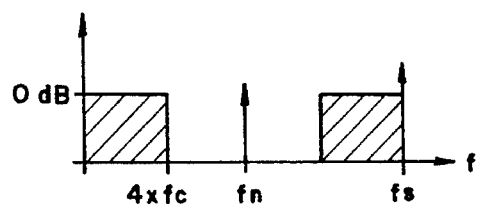

fc : CUT-OFF FREQUENCY
fs : SAMPLING FREQUENCY
fn : NYQUIST FREQUENCY

FIG. 19(e)
COEFFICIENT VECTORS IN CHARACTERISTIC FIG.19(a)

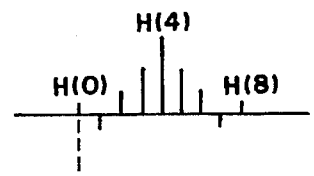

FIG. 19(f)
COEFFICIENT VECTORS IN CHARACTERISTIC FIG.19(b)

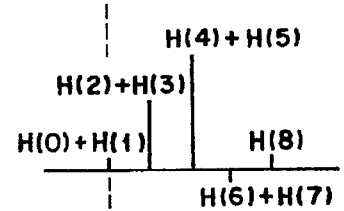

FIG. 19(g)
COEFFICIENT VECTORS IN CHARACTERISTIC FIG.19(c)

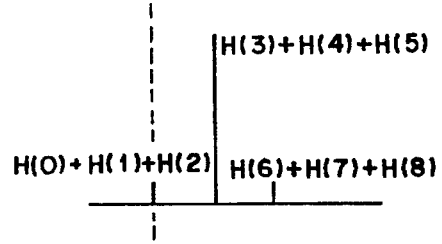

FIG. 19(h)
COEFFICIENT VECTORS IN CHARACTERISTIC FIG.19(d)

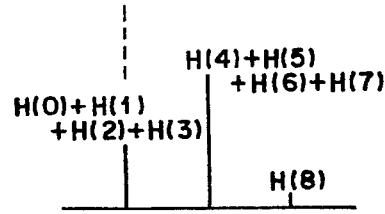

BASIC CHARACTERISTIC

AFTER THINNING OUT

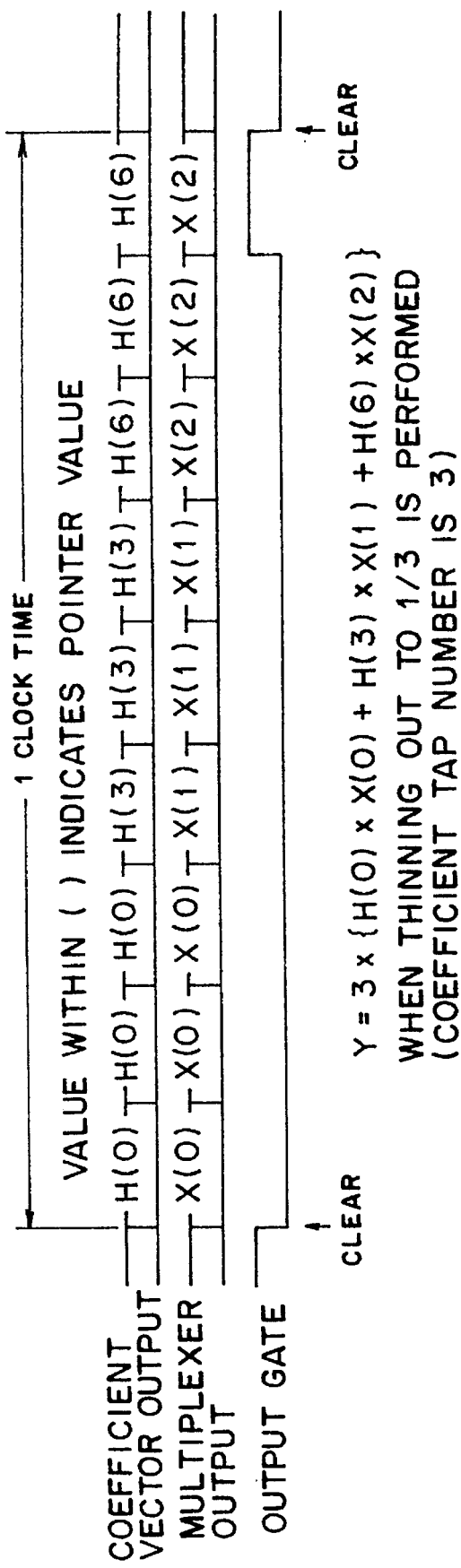

BASIC CHARACTERISTIC

OUTPUT MULTIPLIED BY 3

FIG. 24(a)
ORIGINAL FILTER CHARACTERISTIC

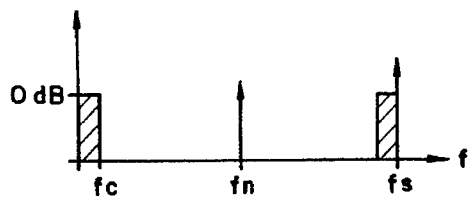

FIG. 24(b)
FILTER CHARACTERISTIC FOR THINNING OUT OF COEFFICIENT VECTORS TO 1/2

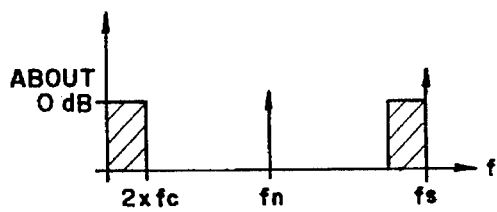

FIG. 24(c)
FILTER CHARACTERISTIC FOR THINNING OUT OF COEFFICIENT VECTORS TO 1/3

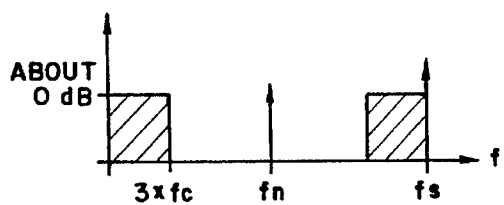

FIG. 24(d)
FILTER CHARACTERISTIC FOR THINNING OUT OF COEFFICIENT VECTORS TO 1/4

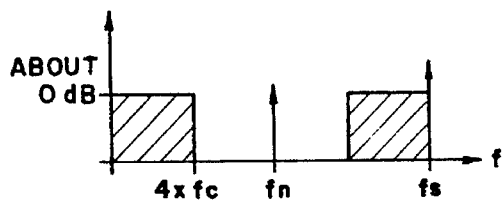

fc : CUT-OFF FREQUENCY
fs : SAMPLING FREQUENCY
fn : NYQUIST FREQUENCY

FIG. 24(e)
COEFFICIENT VECTORS IN CHARACTERISTIC FIG. 24(a)

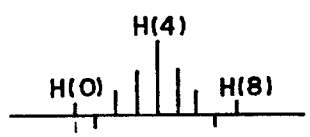

FIG. 24(f)
COEFFICIENT VECTORS IN CHARACTERISTIC FIG. 24(b)

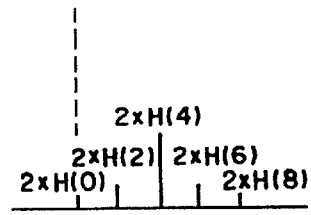

FIG. 24(g)
COEFFICIENT VECTORS IN CHARACTERISTIC FIG. 24(c)

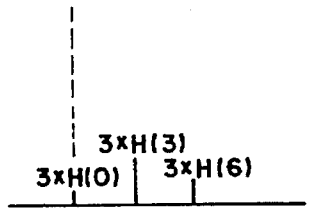

FIG. 24(h)
COEFFICIENT VECTORS IN CHARACTERISTIC FIG. 24(d)

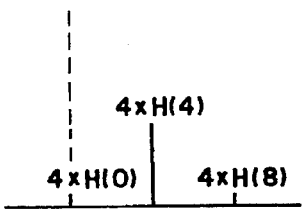

FIG. 25(a)
ORIGINAL FILTER CHARACTERISTIC

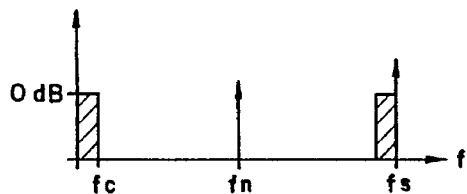

FIG. 25(b)
FILTER CHARACTERISTIC FOR THINNING OUT OF COEFFICIENT VECTORS TO 1/2

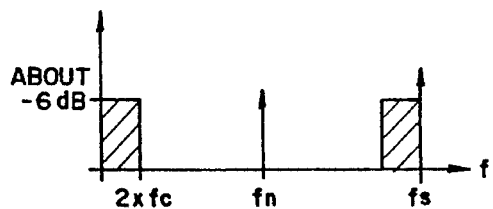

FIG. 25(c)
FILTER CHARACTERISTIC FOR THINNING OUT OF COEFFICIENT VECTORS TO 1/3

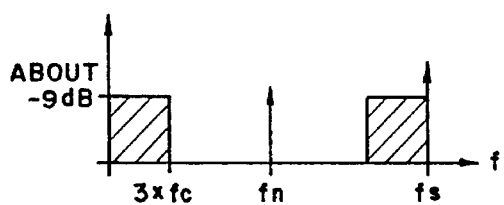

FIG. 25(d)
FILTER CHARACTERISTIC FOR THINNING OUT OF COEFFICIENT VECTORS TO 1/4

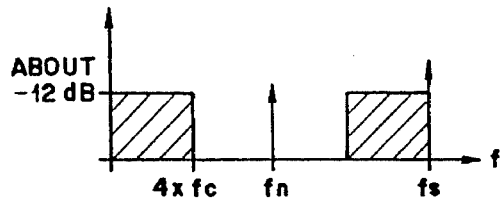

fc: CUT-OFF FREQUENCY
fs: SAMPLING FREQUENCY
fn: NYQUIST FREQUENCY

FIG. 25(e)
COEFFICIENT VECTORS IN CHARACTERISTIC FIG. 25(a)

FIG. 25(f)
COEFFICIENT VECTORS IN CHARACTERISTIC FIG. 25(b)

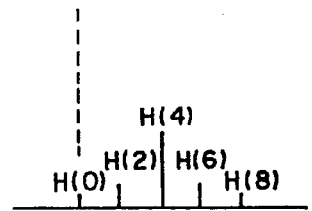

FIG. 25(g)
COEFFICIENT VECTORS IN CHARACTERISTIC FIG. 25(c)

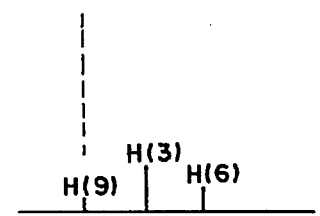

FIG. 25(h)
COEFFICIENT VECTORS IN CHARACTERISTIC FIG. 25(d)

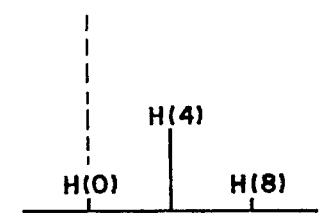

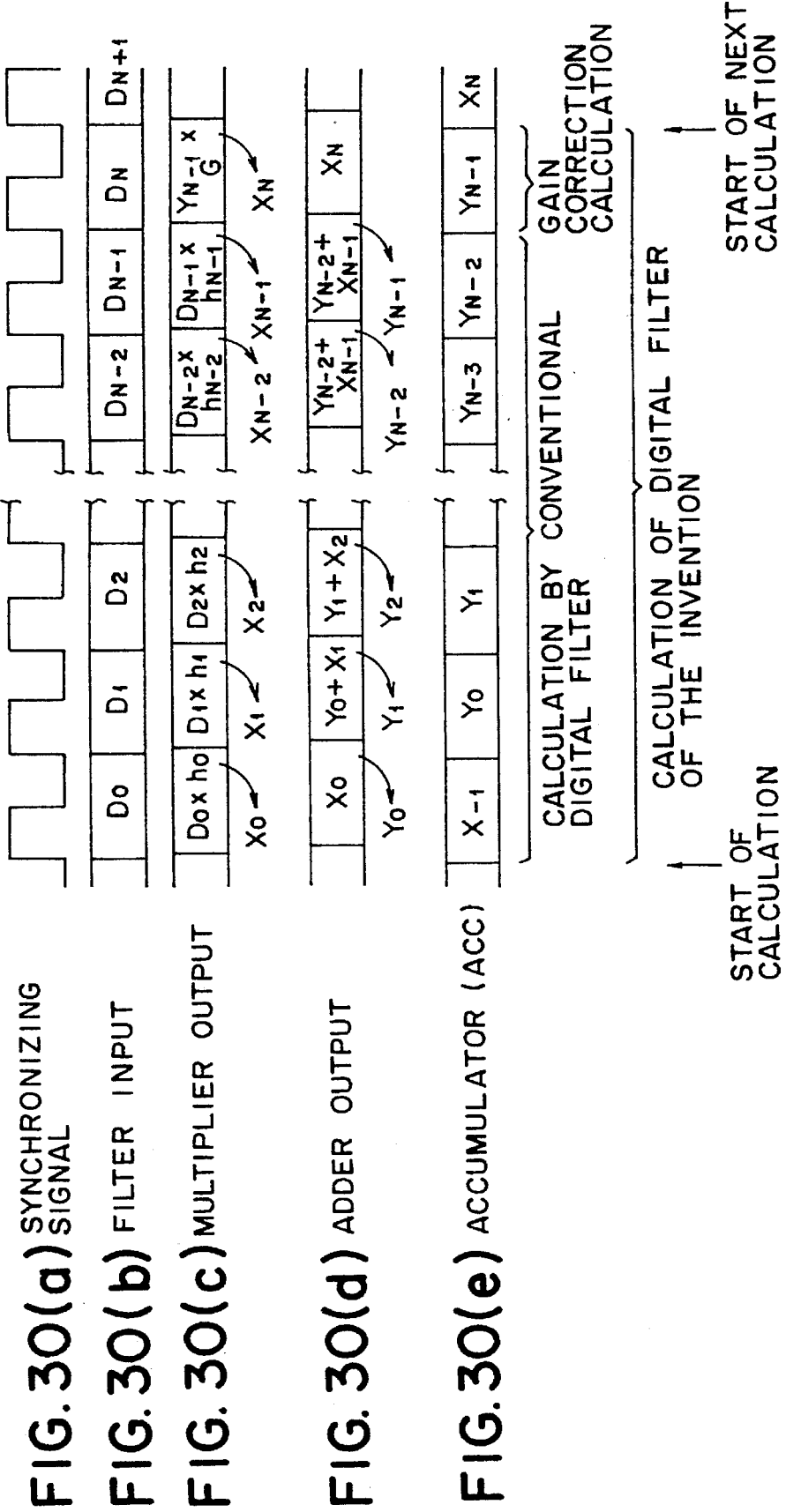

DECIMAL POINT POSITION

WHEN NON-NEGATIVE MULTIPLIER IS USED

DECIMAL POINT POSITION

X IS "0" OR "1"

WHEN MULTIPLIER FOR RECIPROCAL NUMBER TO 2 IS USED

DIGITAL FILTER AND OVERSAMPLING ANALOG TO DIGITAL CONVERTER EMPLOYING THE SAME

BACKGROUND OF THE INVENTION

1) Field of the Invention

This invention relates to a digital filter and an oversampling analog to digital converter which employs the digital filter.

2) Description of the Related Art

Analog data which are generally obtained in the fields of geophysical explorations, medical equipments or measurement instruments are processed by analog to digital conversion (A/D conversion), and digital time series data obtained as an output of the analog to digital conversion are processed by data processing after they are processed by filtering processing.

In this instance, when digital time series data are processed by low-pass filtering processing using plurality of cut-off frequencies, it is required that the cut-off characteristics be similar to each other.

As such analog to digital converter, for example, oversampling analog to digital converters have conventionally been developed which include a combination of a $\Delta\Sigma$ modulator and a decimation filter (digital low-pass filter which thins out data making use of a digital filter of the FIR type).

By the way, a digital filter of the FIR type which is used as a decimation filter is a digital filter whose impulse response has a definite length and which performs convolution calculation using a tap coefficient and input data to effect filtering processing. Such digital filter of the FIR type is shown in model diagram in FIG. 33 and in block diagram in FIG. 34.

Referring to FIGS. 33 and 34, in the digital filter of the FIR type shown, reference characters 1-0 to 1-(N−1) (N is a natural number) denote each a delay circuit for one clock time, 2 and 2-0 to 2-N denote each a multiplier, 3 and 3' denote each an adder, reference character 4 denotes an accumulator (accumulation means), reference characters 5 and 6 denote each a multiplexer, reference character 7 denotes coefficient vector setting means, 8 pointer means, and 9 a gate.

In the digital filter of the FIR including the components described above, the pointer means 8 outputs a common control signal P to the multiplexers 5 and 6 so that they successively output input signals thereto. Consequently, the multiplexers 5 and 6 successively output an input X(i) (i=0 to N) and a corresponding coefficient vector H(i), and the outputs of them are multiplied by each other by the multiplier 2 (2-i). A result of the multiplication and accumulation information of the accumulator 4 are added to each other by the adder 3 or 3', and a result of the addition is accumulated as the accumulation information in the accumulator 4 so as to allow such convolution calculation to be repeated subsequently. After such product sum calculation is repeated by N+1 times, the gate 9 is opened so that an output Y (=$\Sigma$H(i)·X(i)) of the gate 9 is outputted as an output of the digital filter of the FIR type.

By the way, in order to vary the cut-off frequency among fc, 2xfc, 3xfc, ... , Nxfc in digital low-pass filtering processing performed by such a decimation filter as described above, it is a common practice to prepare, as shown in FIG. 35, filter banks 7-1, ... , 7-N in which different coefficient vectors corresponding to the individual cut-off frequencies are stored in advance so that a desired filter bank 7-i may be selected in accordance with the necessity to select a necessary coefficient vector.

Meanwhile, as a low-pass filter (for thinning out of conversion data) of the FIR type for use with an oversampling analog to digital converter, half band filters (HBFs) 10-1, 10-2, ... , 10-N which are connected in cascade connection (tandem connection) in order to allow variation of the cut-off frequency are used as shown in FIG. 36. It is to be noted that reference characters 11-1, 11-2, ... , 11-N denote each a decimator, and reference character f denotes a sampling rate.

By the way, when analog to digital conversion is performed, a gain error is produced. The gain error can be corrected using, as shown in FIG. 37, a divider 12 which divides an output value of a digital filter by a correction value set to a correction value register (REG) 13.

More particularly, referring to FIG. 37, when two arbitrary values (normally a positive (+) full scale and a negative (−) full scale, here, represented by I1 and I2, respectively) are inputted to the input of the digital filter, then values obtained by filtering processing are outputted from the digital filter. In this instance, from the input values I1 and I2 and output values O1 and O2, the ratio $$(O2-O1)/(I2-I1) \tag{1}$$

is calculated and stored into the correction register 13. Thereafter, the output of the filter can be divided by the data stored in the correction register 13 to obtain a value for which the gain error has been corrected.

Such correction, however, is conventionally performed using a divider or a like element outside such digital filter.

With the digital filter of the FIR type described above, however, when the filter banks are used for ordinary digital low-pass filtering processing, they must have coefficient vectors corresponding to individual cut-off frequencies. Accordingly, there is a subject to be solved in that, when it is tried to incorporate the digital filter into an LSI, a large number of gates are required and the efficient is low.

Meanwhile, the cascade connection (tandem connection) construction of half band filters for use for oversampling analog to digital conversion (thinning out of conversion data) only allows thinning out of $½^N$, and rounding processing of data is required at the output section of each stage.

Further, some filters are unnecessary depending upon the cut-off frequencies, and accordingly, the efficiency in use is low. As a possible solution to avoid the situation, a single filter may be used in a multiplexed condition. This, however, complicates the construction of a control circuit.

Accordingly, an FIR filter is demanded whose cut-off frequency can be varied with minimized number of filter coefficient vectors by a simple control circuit.

Further, the prior art digital filter requires a divider outside the same in order to correct a gain error produced upon analog to digital conversion. Thus, the prior art digital filter has a subject to be solved in that such requirement for a divider complicates the structure and complicates the calculation procedure.

SUMMARY OF THE INVENTION

It is an object of the present invention to provide a digital filter whose cut-off frequency can be varied by a simple control circuit.

It is another object of the present invention to provide a digital filter wherein gain correction calculation can be performed by multiplication means so that the digital filter itself has a gain correction calculation function.

It is a further object of the present invention to provide an oversampling analog to digital converter which includes an improved digital filter as a decimation filter so that the cut-off frequency can be varied by a simple control circuit or a correction function for a gain error produced by analog to digital conversion can be built in the oversampling analog to digital converter.

In order to attain the objects described above, according to an aspect of the present invention, there is provided a digital filter, which comprises tap coefficient setting means for setting a tap coefficient, and convolution calculation means for performing convolution calculation using the tap coefficient from the tap coefficient setting means and input data, the convolution calculation means being constructed, in order to allow variation of the cut-off frequency of the digital filter, so as to repetitively perform the processing of first performing repetitive convolution calculation wherein a same convolution calculation operation is performed once or successively by a plurality of times using same tap coefficients or input data and then varying the tap coefficient or the input data to allow the repetitive convolution calculation to be repeated subsequently.

Since the digital filter is additionally provided with the function of using the tap coefficients commonly to vary the cut-off frequency in this manner, it is advantageous in that the cut-off frequency can be varied readily with a simple construction. Consequently, there is another advantage in that the digital filter of the cut-off frequency variation type can be manufactured with a simple construction and can be formed readily into an LSI. Further, there is a further advantage in that such formation into an LSI contributes very much to down-sizing.

The digital filter may further comprise pointer means for controlling so that the same tap coefficient or the same input data may be supplied once or successively by a plurality of times to the convolution calculation means. With the construction, the cut-off frequency can be varied readily by making the control signal from the pointer means different for extraction of a tap coefficient or for extraction of input data while using the tap coefficients commonly. Consequently, it is advantageous in that the digital filter of the cut-off frequency variation type can be manufactured with a simple construction and can be formed readily into an LSI, and such formation into an LSI contributes very much to down-sizing.

Further, the tap coefficient setting means may have a number of tap coefficients set in advance therein with which a selectable lowest cut-off frequency can be realized. With the construction, common use of the tap coefficients can be performed with certainty.

According to another aspect of the present invention, there is provided a digital filter for use with an apparatus which requires correction of a gain error caused by analog to digital conversion, which comprises tap coefficient setting means for setting a tap coefficient, convolution calculation means for performing convolution calculation using the tap coefficient from the tap coefficient setting means and input data, and correction value setting means for setting a correction value with which correction of the gain error should be performed, the convolution calculation means including multiplication means by which gain correction is performed using the correction value received from the correction value setting means.

Since the digital filter is additionally provided with the function of performing gain correction using the multiplication means in the filter, it is advantageous in that a digital filter having the gain correction function can be realized and consequently the necessity for an external circuit for gain correction is eliminated and besides formation of the digital filter into an LSI is facilitated.

The convolution calculation means may include, in addition to the multiplication means which performs multiplication calculation between the tap coefficient from the tap coefficient setting means and the input data, addition means for adding a result of the multiplication by the multiplication means to accumulation information, accumulation means for accumulating a result of the addition by the addition means as the accumulation information, a first selector for selectively outputting the tap coefficient from the tap coefficient setting means or the correction value from the correction value setting means to the multiplication means, and a second selector for supplying a result of the accumulation by the accumulation means to the addition means when the first selector selects the tap coefficient but supplying zero information to the addition means when the first selector selects the correction value. The construction provides the advantage that the gain correction function can be constructed readily with a high degree of accuracy in the inside of the digital filter.

According to a further aspect of the present invention, there is provided a digital filter, which comprises first digital filter section including first tap coefficient setting means for setting a first tap coefficient and first convolution calculation means for performing convolution calculation using the first tap coefficient from the first tap coefficient setting means and input data, the first convolution calculation means being constructed, in order to allow variation of the cut-off frequency of the digital filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently, a second digital filter section provided at a following stage to the first digital filter section and including second tap coefficient setting means for setting a second tap coefficient, second convolution calculation means for performing convolution calculation using the second tap coefficient from the second tap coefficient setting means and the input data, and correction value setting means for setting a correction value with which correction of a gain error should be performed, the second convolution calculation means performing gain correction by means of multiplication means using the correction value received from the correction value setting means.

With the digital filter of the construction, the advantages of simplification in construction, facilitation in formation into an LSI and facilitation in down-sizing as well as elimination of the necessity for an external circuit can be achieved without increasing the number of taps.

According to a still further aspect of the present invention, there is a digital filter, which comprises tap coefficient setting means for setting a tap coefficient, convolution calculation means for performing convolution calculation using the tap coefficient from the tap coefficient setting means and input data, and correction value setting means for setting a correction value with which correction of a gain error should be performed, the convolution calculation means being constructed, in order to allow variation of the cut-off frequency of the digital filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently, the convolution calculation means performing gain correction by means of multiplication means using the correction value received from the correction value setting means.

With the digital filter of the construction, the advantages of simplification in construction, facilitation in formation into an LSI and facilitation in down-sizing as well as elimination of the necessity for an external circuit can be achieved.

According to a yet further aspect of the present invention, there is provided an oversampling analog to digital converter employing a digital filter, which comprises an analog to digital conversion section, and a decimation filter provided at a following stage to the analog to digital conversion section, the decimation filter being constructed as a digital filter which includes tap coefficient setting means for setting a tap coefficient and convolution calculation means for performing convolution calculation using the tap coefficient from the tap coefficient setting means and input data, the convolution calculation means being constructed, in order to allow variation of the cut-off frequency of the decimation filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently.

With the oversampling analog to digital conversion, since the decimation filter has the function of using the tap coefficients commonly to vary the cut-off frequency thereof, the oversampling analog to digital converter is advantageous in achievement of simplification in construction, facilitation in formation into an LSI and facilitation in down-sizing.

According to a yet further aspect of the present invention, there is provided an oversampling analog to digital converter employing a digital filter, which comprises an analog to digital conversion section, and a decimation filter provided at a following stage to the analog to digital conversion section, the decimation filter being constructed as a digital filter which includes tap coefficient setting means for setting a tap coefficient, convolution calculation means for performing convolution calculation using the tap coefficient from the tap coefficient setting means and input data, and correction value setting means for setting a correction value with which correction of gain error caused by analog to digital conversion by the analog to digital conversion section should be performed, the convolution calculation means being constructed so as to perform gain correction by means of multiplication means using the correction value received from the correction value setting means.

With the oversampling analog to digital converter, since the decimation filter has the function of performing gain correction using the multiplication means in tile filter, the oversampling analog to digital converter is advantageous in elimination of the necessity for an external circuit, facilitation in formation into an LSI and so forth.

According to a yet further aspect of the present invention, there is provided an oversampling analog to digital converter, which comprises an analog to digital conversion section, and a decimation filter provided at a following state to the analog to digital conversion section, the decimation filter including a plurality of decimation filter sections, a first one of the decimation filter sections including first tap coefficient setting means for setting a first tap coefficient and first convolution calculation means for performing convolution calculation using the first tap coefficient from the first tap coefficient setting means and input data, the first convolution calculation means being constructed, in order to allow variation of the cut-off frequency of the decimation filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently, and a second one of the decimation filter sections which is provided at a following stage to the first decimation filter section including second tap coefficient setting means for setting a second tap coefficient, second convolution calculation means for performing convolution calculation using the second tap coefficient from the second tap coefficient setting means and the input data, and correction value setting means for setting a correction value with which correction of a gain error caused by analog to digital conversion by the analog to digital conversion section should be performed, the second convolution calculation means performing gain correction by means of multiplication means using the correction value received from the correction value setting means.

With the oversampling analog to digital converter, the advantages of achievement of simplification in construction, facilitation in formation into an LSI and facilitation in down-sizing as well as elimination of the necessity for an external circuit can be achieved without inviting an increase of the number of taps.

According to a yet further aspect of the present invention, there is provided an oversampling analog to digital converter employing a digital filter, which comprises an analog to digital conversion section, and decimation filter provided at a following stage to the analog to digital conversion section, the decimation filter being constructed as a digital filter which includes tap coefficient setting means for setting a tap coefficient, convolution calculation means for performing convolution calculation using the tap coefficient from the tap coefficient setting means and input data, and correction value setting means for setting a correction value with which correction of a gain error should be performed, the convolution calculation means being constructed, in order to allow variation of the cut-off frequency of the decimation filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently and to perform gain correction by means of multiplication means using the correction value received from the correction value setting means.

With the oversampling analog to digital converter, the advantages of simplification in construction, facilitation in formation into an LSI and facilitation in down-sizing as well as elimination of the necessity for an external circuit can be achieved.

Further objects, features and advantages of the present invention will become apparent from the following detailed description when read in conjunction with the accompany-

BRIEF DESCRIPTION OF THE DRAWINGS

FIGS. 14 and 15 are time charts illustrating different operations of the decimation filter shown in FIG. 12;

FIGS. 16(a) to 16(f), 17(a) to 17(f), and 18(a) to 18(f) are time charts illustrating different operations of the pointer means shown in FIG. 13;

FIGS. 19(a) to 19(h) are diagrams illustrating relationships between the coefficient vector and the frequency characteristic of the decimation filter shown in FIG. 12;

FIGS. 21 and 22 are time charts illustrating different operations of the pointer means shown in FIG. 13;

FIGS. 24(a) to 24(h) and 25(a) to 25(h) are diagrams illustrating different relationships between the coefficient vector and the frequency characteristic of the decimation filter shown in FIG. 12;

FIGS. 30(a) to 30(e) is a time chart illustrating operation of the digital filter shown in FIG. 11;

DESCRIPTION OF THE PREFERRED EMBODIMENT a. Aspects of the Invention

Figure 1:
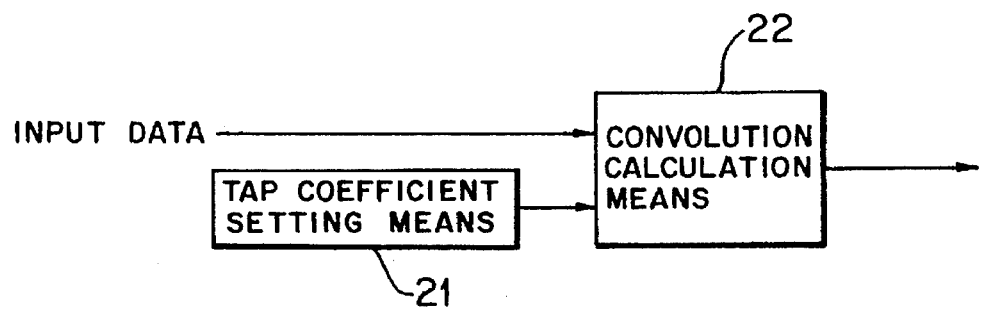
FIGS. 1 to 8 are block diagrams illustrating different aspects of the present invention.

FIG. 1 shows a digital filter according to a first aspect of the present invention. Referring to FIG. 1, the digital filter shown comprises tap coefficient setting means 21 for setting a tap coefficient, and convolution calculation means 22 for performing convolution calculation using the tap coefficient from the tap coefficient setting means 21 and input data. The convolution calculation means 22 is constructed, in order to allow variation of the cut-off frequency of the digital filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently.

The digital filter may further comprise pointer means for controlling so that the same tap coefficient or the same input data may be supplied once or successively by a plurality of times to the convolution calculation means 22.

The tap coefficient setting means 21 has a number of tap coefficients set in advance therein with which a selectable lowest cut-off frequency can be realized.

In the digital filter according to the first aspect of the present invention shown in FIG. 1, the convolution calculation means 22 repetitively performs the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently thereby to vary the cut-off frequency of the digital filter.

Since the digital filter is additionally provided with the function of using the tap coefficients commonly to vary tile cut-off frequency in this manner, the cut-off frequency can be varied readily with simple construction. Consequently, a digital filter of the cut-off frequency variation type of a simple construction can be manufactured, and it can be formed readily into an LSI. Further, such formation into an LSI contributes very much to down-sizing.

Where the pointer means controls so that the same tap coefficient or the same input data are supplied once or successively by a plurality of times to the convolution calculation means 22, the cut-off frequency can be varied readily by making the control signal from the pointer means different for extraction of a tap coefficient or for extraction of input data while using the tap coefficients commonly. Consequently, a digital filter of the cut-off frequency variation type of a simple construction can be manufactured, and it can be formed readily into an LSI. Further, such formation into an LSI contributes very much to down-sizing.

Where the tap coefficient setting means 21 has number of tap coefficients set in advance therein with which a selectable lowest cut-off frequency can be realized, common use of the tap coefficients can be performed with certainty.

Figure 2:
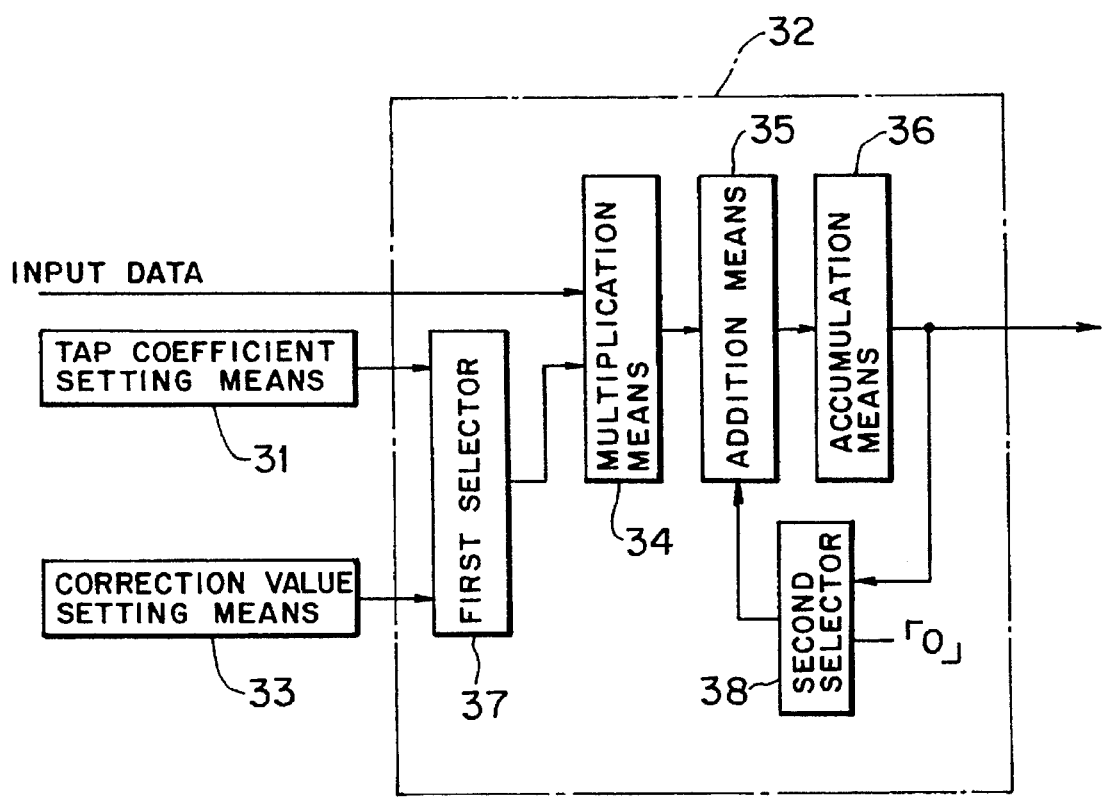

FIG. 2 shows a digital filter according to a second aspect of the present invention. The digital filter is used with an apparatus which requires correction of a gain error caused by analog to digital conversion.

Referring to FIG. 2, the digital filter shown comprises tap coefficient setting means 31 for setting a tap coefficient, convolution calculation means 32 for performing convolution calculation using the tap coefficient from the tap coefficient setting means 31 and input data, and correction value setting means 33 for setting a correction value with which correction of the gain error should be performed. The convolution calculation means 32 includes multiplication means 34 by which gain correction is performed using the correction value received from the correction value setting means 33.

The convolution calculation means 32 includes, in addition to the multiplication means 34 which performs multiplication calculation between the tap coefficient from the tap coefficient setting means 31 and the input data, addition means 35 for adding a result of the multiplication by the multiplication means 34 to accumulation information, accumulation means 36 for accumulating a result of the addition by the addition means 35 as the accumulation information, a first selector 37 for selectively outputting the tap coefficient from the tap coefficient setting means 31 or the correction value from the correction value setting means 33 to the multiplication means 34, and a second selector 38 for supplying a result of the accumulation by the accumulation means 36 to the addition means 35 when the first selector 37 selects the tap coefficient but supplying zero information to the addition means 35 when the first selector 37 selects the correction value.

In the digital filter according to the second aspect of the present invention shown in FIG. 2, the convolution calculation means 32 performs gain correction by the multiplication means thereof using the correction value received from the correction value setting means 33.

Consequently, a digital filter having a gain correction function can be realized. As a result, the necessity for an external circuit for gain correction is eliminated, and also formation of the digital filter into an LSI is facilitated.

In this instance, in the convolution calculation means 32, the multiplication means 34 performs multiplication calculation between the tap coefficient from the tap coefficient setting means 31 and the input data, and the addition means 35 adds a result of the multiplication by the multiplication means 34 to accumulation information. Further, the accumulation means 36 accumulates a result of the addition by the addition means 35 as the accumulation information. When gain correction is to be performed by the convolution calculation means 32, the correction value from the correction value setting means 33 is selected by the first selector 37 and inputted to the multiplication means 34 while zero information is supplied to the addition means 35 by way of the second selector 38.

Consequently, the gain correction function can be constructed readily with certainty in the inside of the digital filter.

Figure 3:
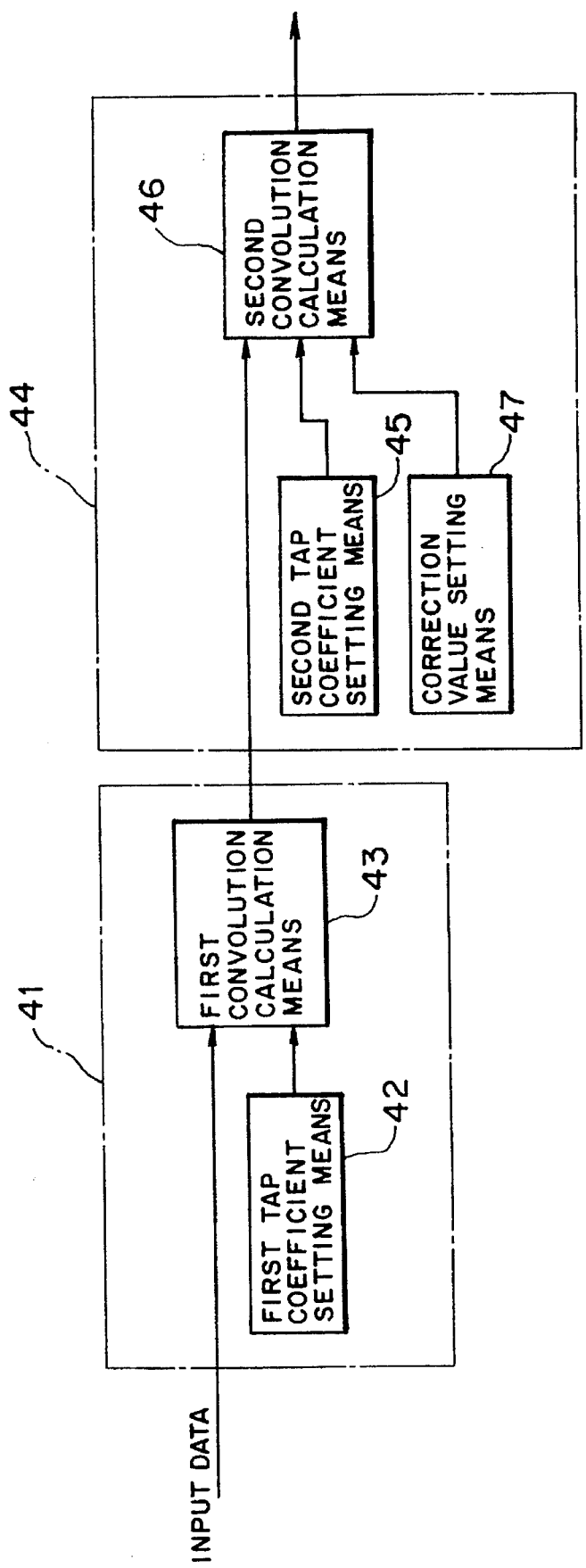

FIG. 3 shows a digital filter according to a third aspect of the present invention. Referring to FIG. 3, the digital filter shown comprises a first digital filter section 41 and a second digital filter section 44. The first digital filter section 41 includes first tap coefficient setting means 42 for setting a first tap coefficient and first convolution calculation means 43 for performing convolution calculation using the first tap coefficient from the first tap coefficient setting means 42 and input data. The first convolution calculation means 43 is constructed, in order to allow variation of the cut-off frequency of the digital filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently.

The second digital filter section 44 is provided at a following stage to the first digital filter section 41 and includes second tap coefficient setting means 45 for setting a second tap coefficient, second convolution calculation means 46 for performing convolution calculation using the second tap coefficient from the second tap coefficient setting means 45 and the input data, and correction value setting means 47 for setting a correction value with which correction of a gain error should be performed. The second convolution calculation means 46 performs gain correction by means of multiplication means using the correction value received from the correction value setting means 47.

In the digital filter according to the third aspect of the present invention shown in FIG. 3, the first convolution calculation means 43 of the first digital filter section 41 repetitively performs the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently thereby to allow variation of the cut-off frequency of the digital filter. Meanwhile, the second convolution calculation means 46 of the second digital filter section 44 performs gain correction by means of the multiplication means thereof using the correction value received from the correction value setting means 47.

Consequently, the advantages of simplification in construction, facilitation in formation into an LSI and facilitation in down-sizing as well as elimination of the necessity for an external circuit can be achieved without increasing the number of taps.

Figure 4:
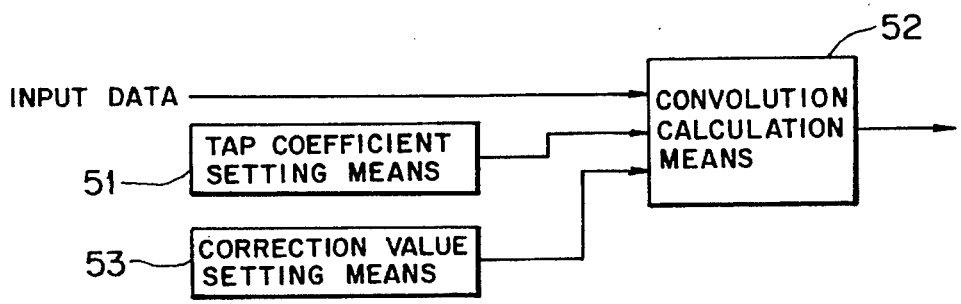

FIG. 4 shows a digital filter according to a fourth aspect of the present invention. Referring to FIG. 4, the digital filter shown comprises tap coefficient setting means 51 for setting a tap coefficient, convolution calculation means 52 for performing convolution calculation using the tap coefficient from the tap coefficient setting means 51 and input data, and correction value setting means 53 for setting a correction value with which correction of a gain error should be performed. The convolution calculation means 52 is constructed, in order to allow variation of the cut-off frequency of the digital filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently. Further, the convolution calculation means 52 performs gain correction by means of multiplication means using the correction value received from the correction value setting means 53.

In tile digital filter according to the fourth aspect of the present invention shown in FIG. 4, the convolution calculation means 52 repetitively performs, in order to allow variation of the cut-off frequency of the digital filter, the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently, and further performs gain correction by means of the multiplication means thereof using the correction value received from the correction value setting means 53.

Since the convolution calculation means has the function of using the tap coefficients commonly to vary the cut-off frequency and the function of performing gain correction using the multiplication means in the digital filter, the advantages of simplification in construction, facilitation in formation into an LSI and facilitation in down-sizing as well as elimination of the necessity for an external circuit can be achieved.

Figure 5:
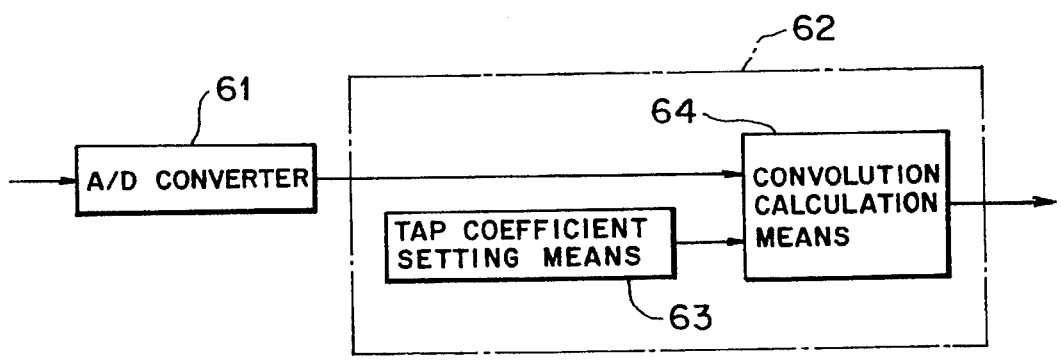

FIG. 5 shows an oversampling analog to digital converter according to a fifth aspect of the present invention. Referring to FIG. 5, the oversampling analog to digital converter comprises an analog to digital (A/D) conversion section 61, and a decimation filter 62 provided at a following stage to the analog to digital conversion section 61. The decimation filter 62 is constructed as a digital filter and includes tap coefficient setting means 63 for setting a tap coefficient and convolution calculation means 64 for performing convolution calculation using the tap coefficient from the tap coefficient setting means 63 and input data. The convolution calculation means 64 is constructed, in order to allow variation of the cut-off frequency of the decimation filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently.

In the oversampling analog to digital converter according to the fifth aspect of the present invention shown in FIG. 5, after analog to digital conversion is performed by the analog to digital conversion section 61, the decimation filter 62 performs thinning out processing. In this instance, the convolution calculation means 64 of the decimation filter 62 repetitively performs, in order to allow variation of the cut-off frequency of the decimation filter, the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently.

Since the decimation filter has the function of using the tap coefficients commonly to vary the cut-off frequency thereof, the oversampling analog to digital converter is advantageous in achievement of simplification in construction, facilitation in formation into an LSI and facilitation in down-sizing.

Figure 6:
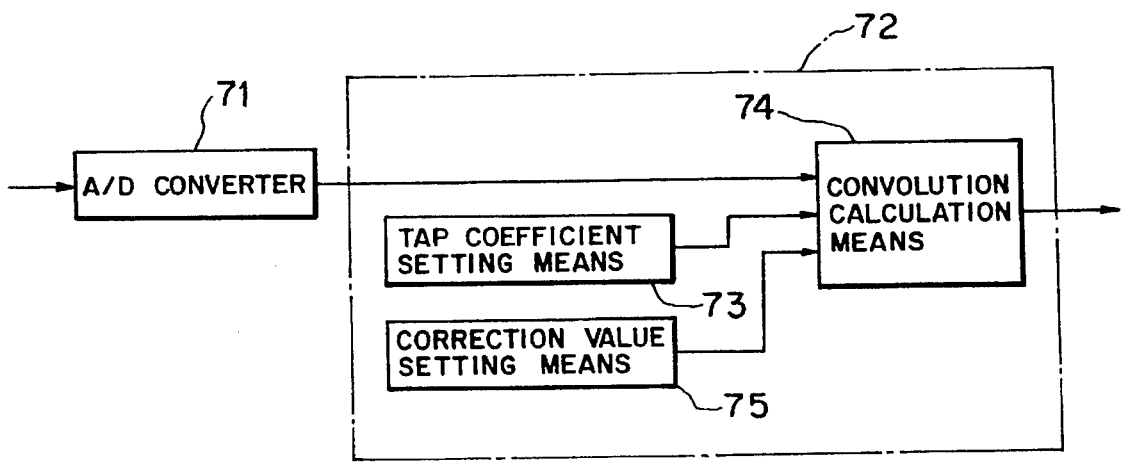

FIG. 6 shows an oversampling analog to digital converter according to a sixth aspect of the present invention. Referring to FIG. 6, the oversampling analog to digital converter shown comprises an analog to digital (A/D) conversion section 71, and a decimation filter 72 provided at a following stage to the analog to digital conversion section 71. The decimation filter 72 is constructed as a digital filter and includes tap coefficient setting means 73 for setting a tap coefficient, convolution calculation means 74 for performing convolution calculation using the tap coefficient from the tap coefficient setting means 73 and input data, and correction value setting means 75 for setting a correction value with which correction of a gain error caused by analog to digital conversion by the analog to digital conversion section 71 should be performed. The convolution calculation means 74 is constructed so as to perform gain correction by means of multiplication means using the correction value received from the correction value setting means 75.

In the oversampling analog to digital converter according to the sixth aspect of the present invention shown in FIG. 6, after analog to digital conversion is performed by the analog to digital conversion section 71, the decimation filter 72 performs thinning out processing. In this instance, the convolution calculation means 74 of the decimation filter 72 performs gain correction by means of the multiplication means thereof using the correction value received from the correction value setting means 75.

Since the decimation filter has the function of performing gain correction using the multiplication means in the filter, the oversampling analog to digital converter does not require an external circuit, and consequently, formation of the oversampling analog to digital converter into an LSI is facilitated.

Figure 7:
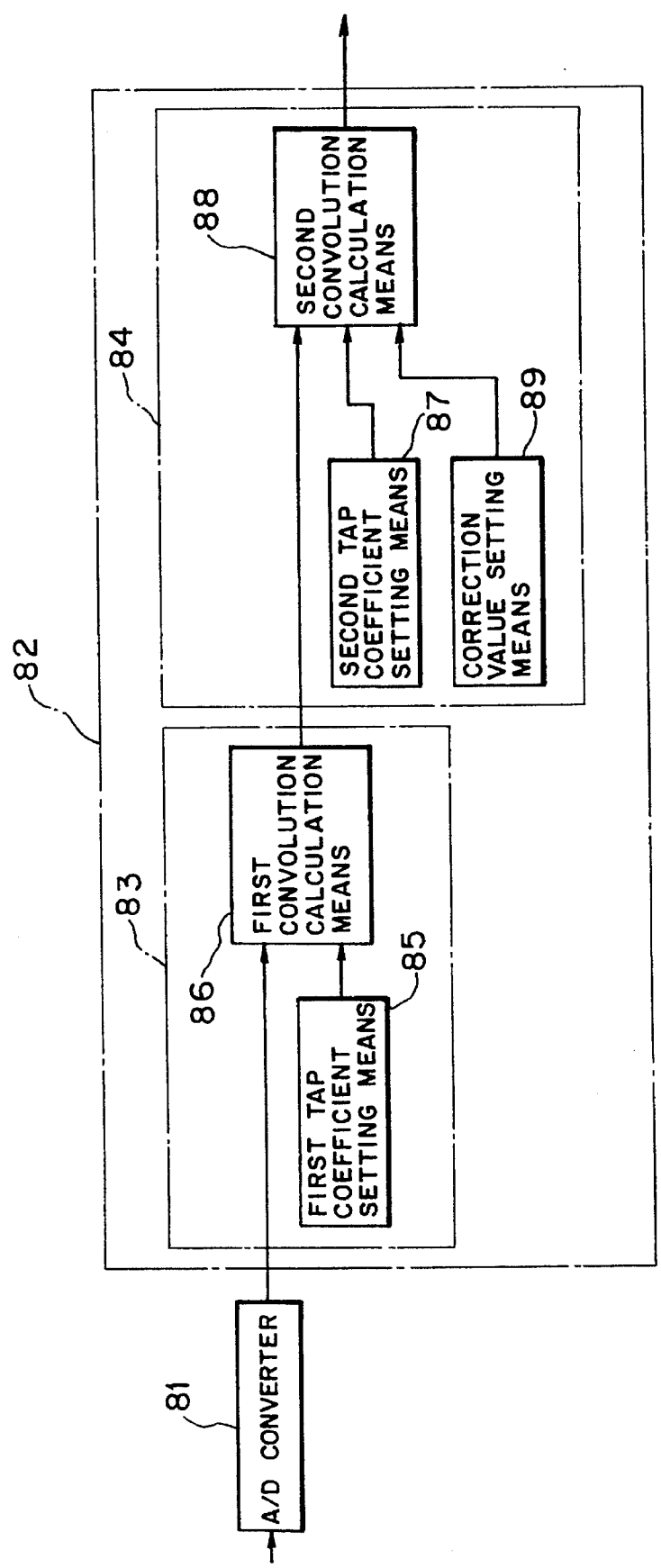

FIG. 7 shows an oversampling analog to digital converter according to a seventh aspect of the present invention. Referring to FIG. 7, the oversampling analog to digital converter comprises an analog to digital (A/D) conversion section 81, and a decimation filter 82 provided at a following state to the analog to digital conversion section 81. The decimation filter 82 includes a plurality of decimation filter sections 83 and 84, and a first one 83 of the decimation filter sections 83 and 84 is constructed as a digital filter and includes first tap coefficient setting means 85 for setting a first tap coefficient and first convolution calculation means 86 for performing convolution calculation using the first tap coefficient from the first tap coefficient setting means 85 and input data. The first convolution calculation means 86 is constructed, in order to allow variation of the cut-off frequency of the decimation filter, as a digital filter which repetitively performs the processing of first performing repetitive convolution calculation wherein a same convolution calculation operation is performed once or successively by a plurality of times using same tap coefficients or same input data and then varies the first tap coefficient or the input data to allow the repetitive convolution calculation to be repeated subsequently. Meanwhile, a second one 84 of the decimation filter sections 83 and 84 which is provided at a following stage to the decimation filter section 83 is constructed as a digital filter and includes second tap coefficient setting means 87 for setting a second tap coefficient, second convolution calculation means 88 for performing convolution calculation using the second tap coefficient from the second tap coefficient setting means 87 and the input data, and correction value setting means 89 for setting a correction value with which correction of a gain error caused by analog to digital conversion by the analog to digital conversion section 81 should be performed. The second convolution calculation means 88 is constructed as a digital filter which performs gain correction by means of multiplication means using the correction value received from the correction value setting means 89.

In the oversampling analog to digital converter according to the seventh aspect of the present invention shown in FIG. 7, after analog to digital conversion is per formed by the analog to digital conversion section 81, the decimation filter 82 performs thinning out processing. In this instance, the first convolution calculation means 86 of the first decimation filter section 83 of the decimation filter 82 repetitively performs, in order to allow variation of the cut-off frequency of the decimation filter, the processing of first performing repetitive convolution calculation wherein a same convolution calculation operation is performed once or successively by a plurality of times using same tap coefficients or same input data and then varies the first tap coefficient or the input data to allow the repetitive convolution calculation to be repeated subsequently. Meanwhile, the second convolution calculation means 88 of the second decimation filter section 84 which is provided at a following stage to the first decimation filter section 83 performs gain correction by means of the multiplication means thereof using the correction value received from the correction value setting means 89.

In this manner, since the decimation filter includes a plurality of decimation filter sections and a first one of the decimation filter sections is constructed as a digital filter having the function of using the tap coefficients commonly to vary the cut-off frequency while a second one of the decimation filter sections provided at a following stage to the first decimation filter section 83 is constructed as a digital filter having the function of performing gain correction using the multiplication means in the filter, the oversampling analog to digital converter can enjoy the advantages of simplification in construction, facilitation in formation into an LSI and facilitation in down-sizing as well as elimination of the necessity for an external circuit without inviting an increase of the number of taps.

Figure 8:
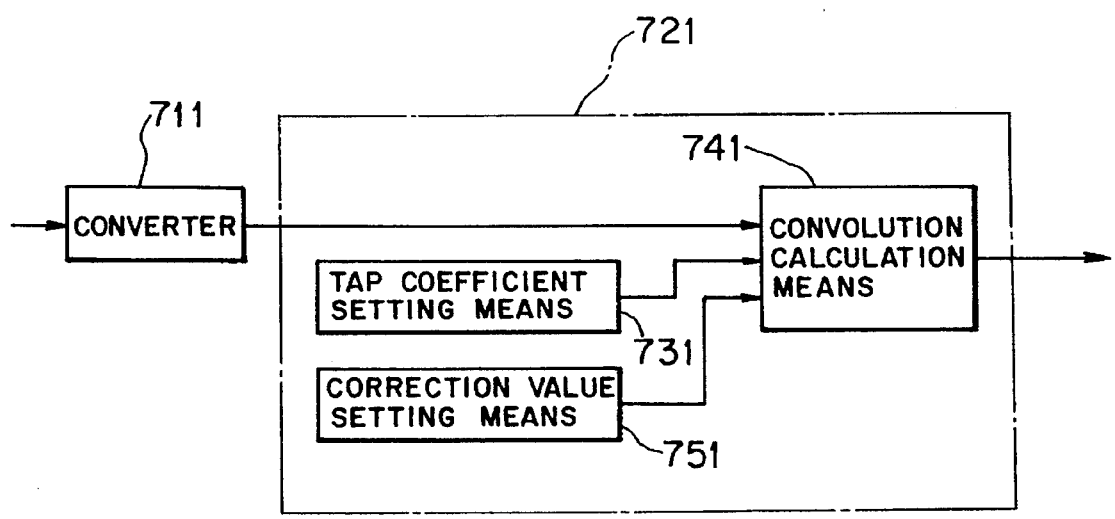

FIG. 8 shows an oversampling analog to digital converter according to an eighth aspect of the present invention. Referring to FIG. 8, the oversampling analog to digital converter shown comprises an analog to digital conversion section 711, and a decimation filter 721 provided at a following stage to the analog to digital conversion section 711. The decimation filter 721 is constructed as a digital filter and includes tap coefficient setting means 731 for setting a tap coefficient, convolution calculation means 741 for performing convolution calculation using the tap coefficient from the tap coefficient setting means 731 and input data, and correction value setting means 751 for setting a correction value with which correction of a gain error should be performed. The convolution calculation means 741 is constructed, in order to allow variation of the cut-off frequency of the decimation filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently and to perform gain correction by means of multiplication means using the correction value received from the correction value setting means 751.

In the oversampling analog to digital converter according to the eighth aspect of the present invention shown in FIG. 8, after analog to digital conversion is performed by the analog to digital conversion section 711, the decimation filter 721 performs thinning out processing. In this instance, the convolution calculation means 741 of the decimation filter 721 repetitively performs, in order to allow variation of the cut-off frequency of the decimation filter, the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently and then performs gain correction by means of the multiplication means thereof using the correction value received from the correction value setting means 751.

In this manner, since the decimation filter is constructed as a digital filter having the function of using the tap coefficients commonly to vary the cut-off frequency and having the function of performing gain correction using the multiplication means in the filter, the oversampling analog to digital converter can enjoy the advantages of simplification in construction, facilitation in formation into an LSI and facilitation in down-sizing as well as elimination of the necessity for an external circuit.

b. Description of the Preferred Embodiment

Figure 9:
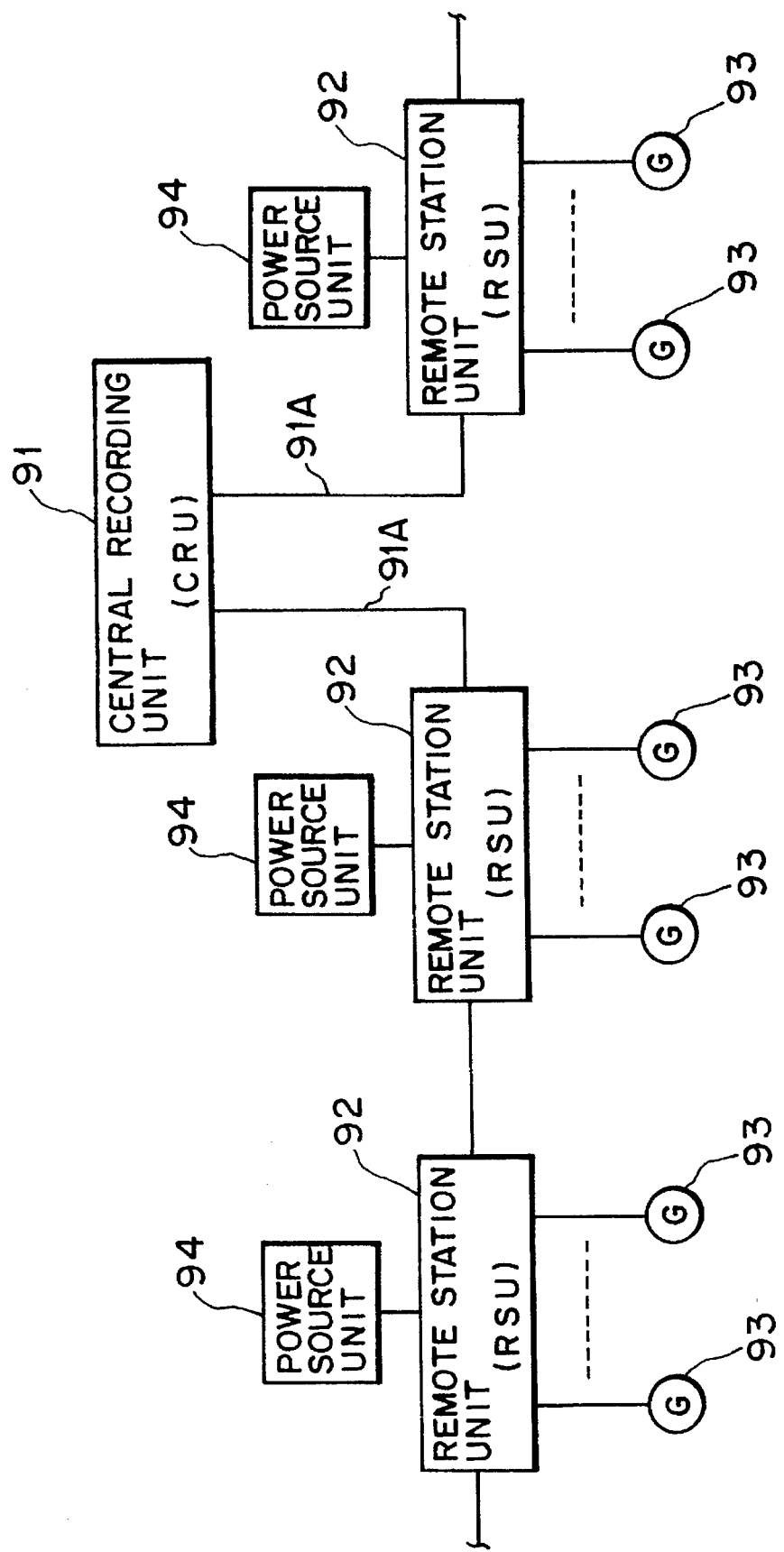
FIG. 9 is a block diagram of an underground resource search data acquisition system.

Referring first to FIG. 9, there is shown a popular underground resource research data acquisition system for acquiring data for search for underground resources such as natural gas or petroleum. In the system shown, a plurality of remote station units (RSU) 92 are connected in tandem connection to a central recording unit (CRU) 91 by way of a digital telemetry cable 91A.

Though not shown, the central recording unit 91 includes a CPU (central processing unit) serving as signal processing means, a memory, input/output interfaces and so forth. The CPU suitably processes digital acquisition data from the remote station units 92 and executes recording processing of the data using the memory.

Figure 10:
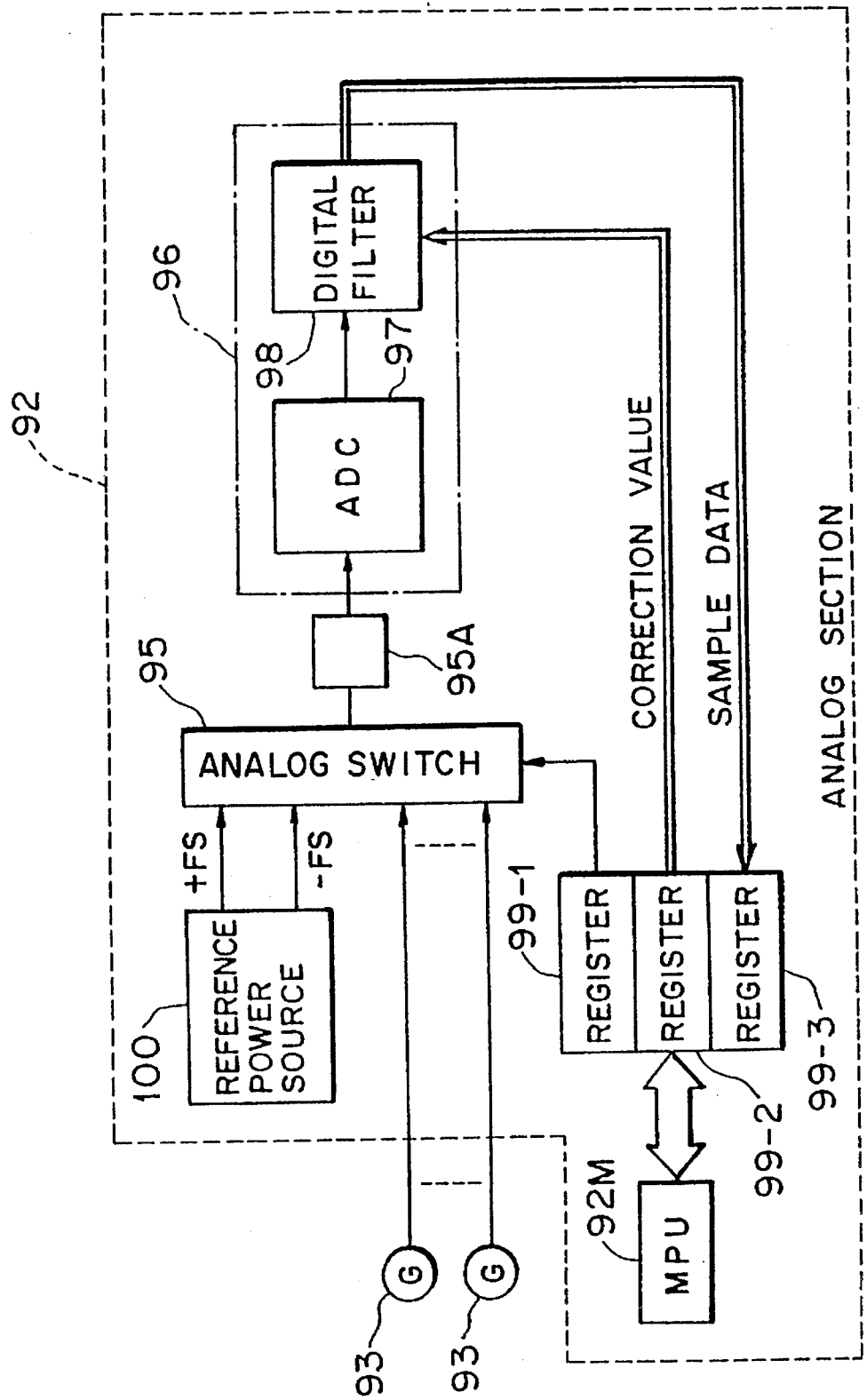
FIG. 10 is a block diagram schematically showing a remote station unit in which an oversampling analog to digital converter to which the present invention is applied is incorporated.

Meanwhile, each remote station unit 92 performs analog to digital conversion processing of detection signals (analog signals) from a plurality of geophones (G) 93 for detecting vibrations of the earth. To this end, each remote station unit 92 has such a construction as shown in FIG. 10. Referring to FIG. 10, the remote station unit 92 shown includes an analog switch 95, an analog filter 95A, an oversampling analog to digital converter 96, three registers 99-1 to 99-3, and a reference power source 100 as well as an MPU (microprocessor) 92M.

The analog switch 95 selectively outputs a signal from a geophone 93 or a signal from the reference power source 100 in response to a switching instruction from the register 99-1.

The analog filter 95A is provided for antialiasing or like operation.

The oversampling analog to digital converter 96 includes an analog to digital converter ($\Delta\Sigma$ modulation section) 97 and a decimation filter (thinning out filter, low-pass filter) 98 connected at a following stage to the analog to digital converter 97. In the oversampling analog to digital converter 96, the analog to digital converter 97 first samples the amplitude of an input analog signal thereto from the analog filter 95A for each oversampling timing to convert the input analog signal into a digital signal with a high frequency, and then the decimation filter 98 cuts off high frequency components of the digital signal from the analog to digital converter 97. Consequently, the input analog signal can be converted into digital data of a rate corresponding to the basic sampling frequency.

It is to be noted that, in the underground resource search data acquisition system, since oscillations are applied to the surface of the earth to detects oscillations of reflection waves thereof by means of a geophone 93, the dynamic range of the detection signal is wide, and since such an oversampling analog to digital converter as described above is suitably applied to convert an analog signal having a wide dynamic range into a digital signal, an oversampling analog to digital converter is employed as the analog to digital converter in the present system.

Figure 11:
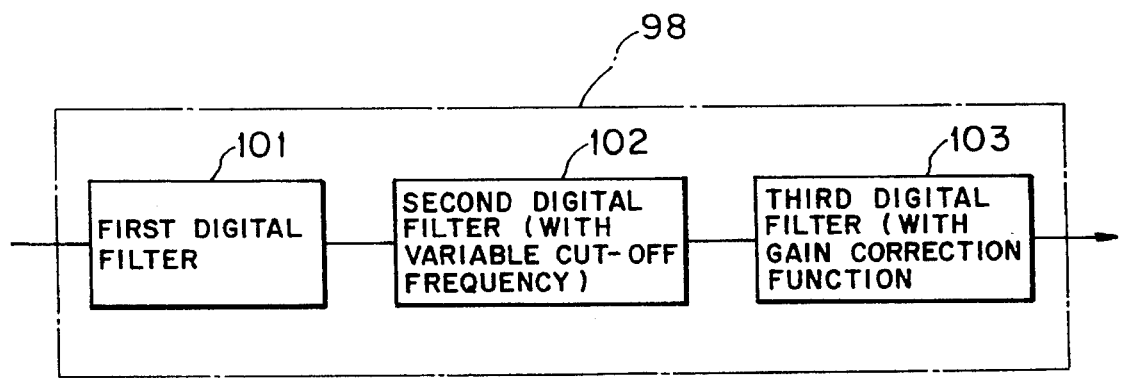
FIG. 11 is a block diagram showing a schematic construction of a decimation filter of the oversampling analog to digital converter incorporated in the remote station unit shown in FIG. 10.

In the remote station unit 92 shown in FIG. 10, the decimation filter 98 is constituted from three digital filters 101 to 103 as shown in FIG. 11 in order to minimize the number of taps. The digital filters 101 to 103 are formed as an LSI.

Referring to FIG. 11, the first digital filter (first decimation filter section) 101 and the third digital filter (third decimation filter section) 103 have fixed thinning out rates, that is, fixed cut-off frequencies, and the first digital filter 101 has a greater number o f taps than the third digital filter 103.

Meanwhile, the second digital filter (second decimation filter section) 102 has a variable thinning out rate, that is, a variable cut-off frequency, and can perform, for example, four different kinds of thinning out. The number of taps of the second digital filter 102 is equal to that of the first digital filter 101.

Further, the third digital filter 103 has a function of correcting a gain error caused by analog to digital conversion by the analog to digital converter 97.

The second digital filter 102 having a variable cut-off frequency will be described in detail first. In particular, referring now to FIG. 12, the second digital filter 102 includes eight one-clock time delay circuits 1-0 to 1-7, a multiplier 2, an adder 3, an accumulator (accumulation means) 4, a pair of multiplexers 5 and 6, coefficient vector setting means (first tap coefficient setting means) 107, pointer means 108, and a gate (GT) 9.

In the second digital filter 102 including the elements mentioned above, the pointer means 108 delivers a pair of different control signals P1 and P2 to the multiplexers 5 and 6 so that the multiplexers 5 and 6 output an input X(i) (i=0 to N) and a corresponding coefficient vector H(i), respectively. The outputs of the multiplexers 5 and 6 are multiplied by each other by the multiplier 2, and a result of the multiplication and accumulation information in the accumulator 4 are added to each other by the adder 3. A result of the addition is accumulated to the accumulation information in the accumulator 4 so that such product sum calculation may thereafter be repeated. After the product sum calculation is repeated by nine times in this manner, the gate 9 is opened so that an output Y (=ΣH(i)·X(i))) is outputted as an output of the second digital filter 102.

Accordingly, the second digital filter 102 has a function of the first tap coefficient setting means (coefficient vector setting means) 107 as well as another function of first convolution calculation means 109 for performing convolution calculation using a coefficient vector (first tap coefficient) H(i) from the first tap coefficient vector setting means 107 and input data X(i).

Further, in the present embodiment, in order to achieve variation of the cut-off frequency, the first convolution calculation section 109 is constructed so as to repetitively perform the processing of first performing repetitive convolution calculation wherein a same convolution calculation operation is performed once or successively by a plurality of times using different coefficient vectors and the same input data and then varying the coefficient vectors and the input data to allow the repetitive convolution calculation to be repeated subsequently.

Figure 13:
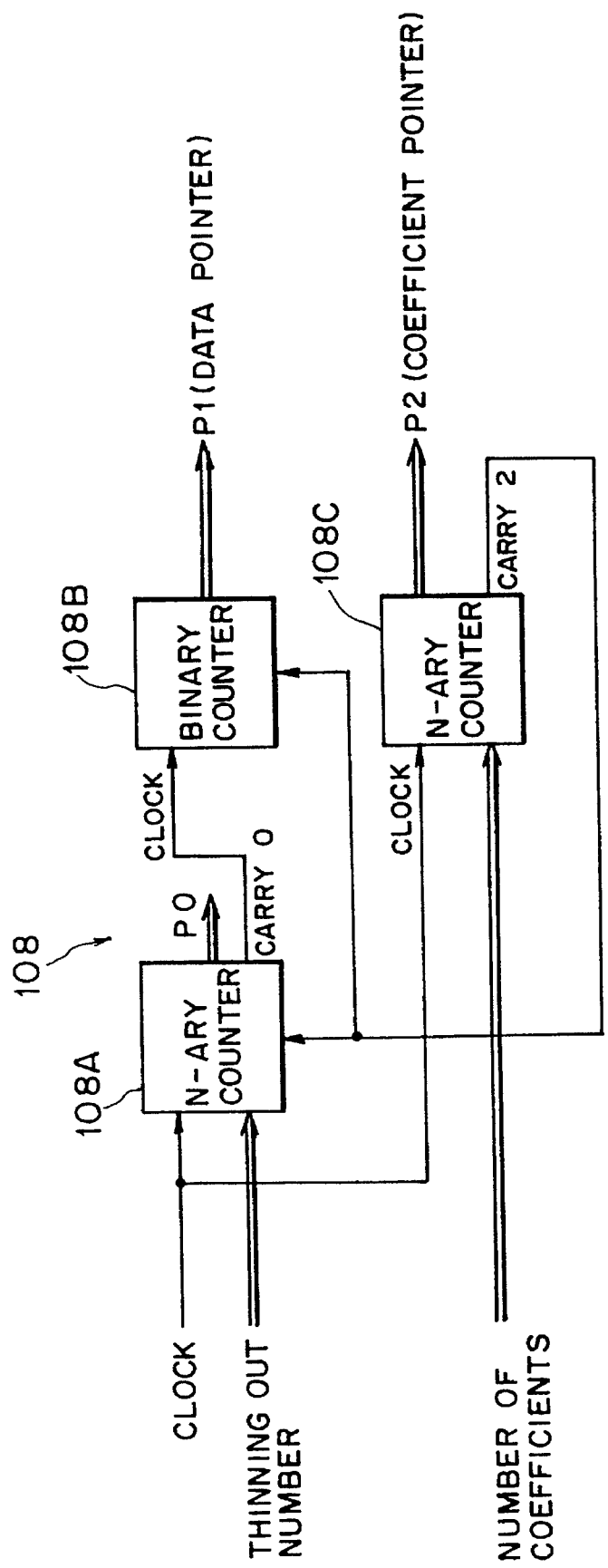
FIG. 13 is a block diagram showing pointer means of the decimation filter shown in FIG. 12.

In this instance, the pointer means 108 is constructed so as to output the control signals P1 and P2 so that different coefficient vectors and the same input data may be supplied once or successively by a plurality of times to the first convolution calculation means 109. To this end, the pointer means 108 includes two N-ary counters 108A and 108C and a binary counter 108B as shown in FIG. 13.

The N-ary counter 108A is loaded with a thinning out number (cut-off frequency information) and outputs a signal P0. The N-ary counter 108C is loaded with a number of coefficients and outputs a coefficient pointer signal P2. Meanwhile, the binary counter 108B receives a carry signal of the N-ary counter 108A as a clock and outputs a data pointer signal P1. It is to be noted that the N-ary counter 108A and the binary counter 108B are reset by a carry signal of the N-ary counter 108C.

Consequently, the signal P0 is incremented at the rising edge of a clock signal and is cleared at the falling edge of a carry signal 0 or a carry signal 2; the signal P1 is incremented at the falling edge of the carry signal 0 and is cleared at the falling edge of the carry signal 2; and the signal P2 is incremented at the falling edge of the clock signal and is cleared at the falling edge of the carrier signal 2.

An example of the output of the pointer means 108 having the construction described above when the coefficient tap number is 9 is illustrated in Table 1 below.

TABLE 1

Example of Output of Pointer Means
(when coefficient tap number is 9)

| Thinning Out of Coefficients | | Outputs of Pointer Means | Cut-off Frequency |
| --- | --- | --- | --- |
| 1/1 | P1 | 0, 1, 2, 3, 4, 5, 6, 7, 8 | fc |
|  | P2 | 0, 1, 2, 3, 4, 5, 6, 7, 8 |  |
| 1/2 | P1 | 0, 0, 1, 1, 2, 2, 3, 3, 4 | 2 × fc |
|  | P2 | 0, 1, 2, 3, 4, 5, 6, 7, 8 |  |
| 1/3 | P1 | 0, 0, 0, 1, 1, 1, 2, 2, 2 | 3 × fc |
|  | P2 | 0, 1, 2, 3, 4, 5, 6, 7, 8 |  |
| 1/4 | P1 | 0, 0, 0, 0, 1, 1, 1, 1, 2 | 4 × fc |
|  | P2 | 0, 1, 2, 3, 4, 5, 6, 7, 8 |  |

The filter characteristics at the cut-off frequencies fc, 2xfc, 3xfc and 4xfc listed in Table 1 are illustrated in FIGS. 19(a) to 19(d).

Meanwhile, signal time charts at several locations in the pointer means 108 when the thinning out rate for coefficients indicated also in Table 1 is ½ are shown in FIGS. 16(a) to 16(f); signal time charts at the several locations in the pointer means 108 when the thinning out rate for coefficients is ⅓ are shown in FIGS. 17(a) to 17(f); and signal time charts at the several locations in the pointer means 108 when the thinning out rate for coefficients is ¼ are shown in FIGS. 18(a) to 18(f).

Figure 14:
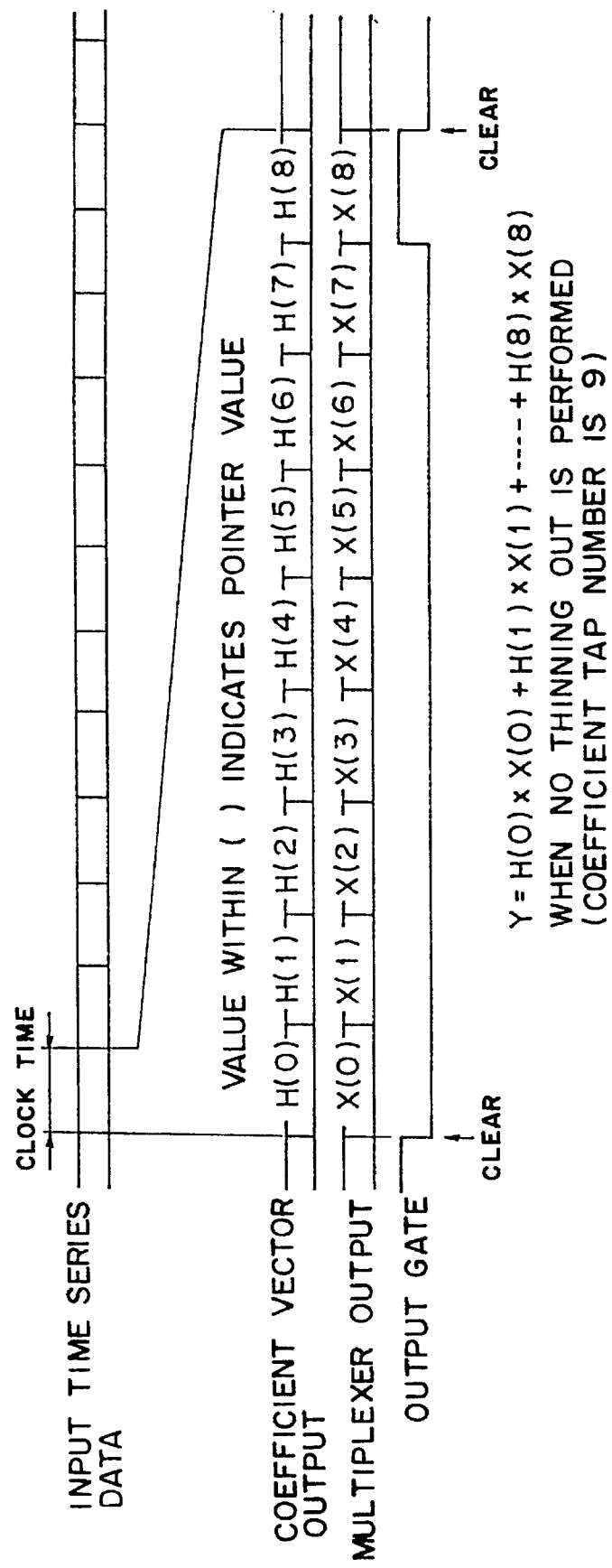

Accordingly, the time charts of the coefficient vector output, the multiplexer output (input time series data) and the output gate output of the second digital filter 102 when it does not perform a thinning out operation become such as shown in FIG. 14. Meanwhile, the time charts of the coefficient vector output, the multiplexer output (input time series data) and the output gate output of the second digital filter 102 when it performs a thinning out operation (thinning out to ⅓) become such as shown in FIG. 15.

It is to be noted that, the output Y of the output gate 9 (the output of the second digital filter 102) when thinning out is not performed is given by $$Y = H(0) \times X(0) + H(1) \times X(1) \ldots + H(8) \times X(8)$$

but the output Y of the output gate 9 (the output of the second digital filter 102) when ⅓ thinning out is performed is given by $$\begin{aligned} Y = \ &X(0) \times [H(0) + H(1) + H(2)] + \\ &X(1) \times [H(3) + H(4) + H(5)] + \\ &X(3) \times [H(6) + H(7) + H(8)] \end{aligned}$$

From this, it can be seen that the first convolution calculation section 109 repetitively performs the processing of first performing repetitive convolution calculation wherein a same convolution calculation operation is performed once (when no thinning out operation is performed) or successively by a plurality of times (when a thinning out operation is performed) using different coefficient vectors and the same input data and then varying the coefficient vectors and the input data to allow the repetitive convolution calculation to be repeated subsequently. Also it can be seen that the cut-off frequency can be varied by the countermeasure just described.

It is to be noted that a number of coefficient vectors (tap coefficients) with which the selectable lowest cut-off frequency fc can be realized (in this instance, the number is 9) are set in the coefficient vector setting means 107 in advance, but separate coefficient vector setting means are not provided for the different cut-off frequencies 2xfc, 3xfc and 4xfc. This is based on the fact that the filter characteristics at the cut-off frequencies fc, 2xfc, 3xfc and 4xfc and the coefficient vectors have such relationships as illustrated in FIGS. 19(a) to 19(d) and 19(e) to 19(h), that is, the coefficient vectors required for the filter characteristics having the cut-off frequencies other than the lowest cut-off frequency fc are included in the coefficient vector required for the filter characteristic having the lowest cut-off frequency fc. In other words, if a number of coefficient vectors with which the lowest cut-off frequency fc can be realized are prepared, then the filter characteristics at the other cut-off frequencies 2xfc, 3xfc and 4xfc can be realized.

By making the control signals P1 and P2 from the pointer means 108 different from each other for the multiplexers 5 and 6, respectively, while using coefficient vectors commonly in this manner, the cut-off frequency can be varied readily, and consequently, digital filter having a variable cut-off frequency can be manufactured with a simple construction. Due to such simple construction, formation into an LSI can be achieved readily. Such formation in an LSI contributes very much to down-sizing comparing with an alternative case wherein the digital FIR filter is constituted from a digital signal processor.

Further, where a digital FIR filter is constituted from an LSI, reduction of the number of gates can be achieved by reduction or simplification of filter banks, a rounding circuit and a control circuit, and consequently, enhancement in efficiency in designing can be achieved.

Figure 20A:
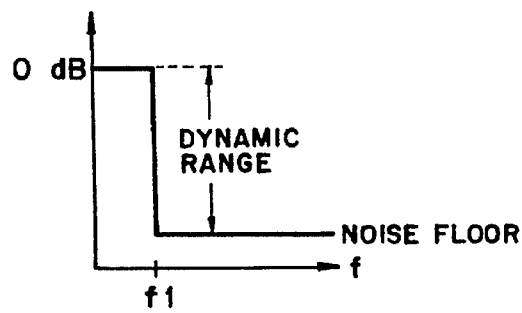
FIGS. 20(a) and 20(b) are diagrams illustrating the basic frequency characteristic and the characteristic after thinning out of coefficients of the decimation filter shown in FIG. 12, respectively, for comparison.
Figure 20B:
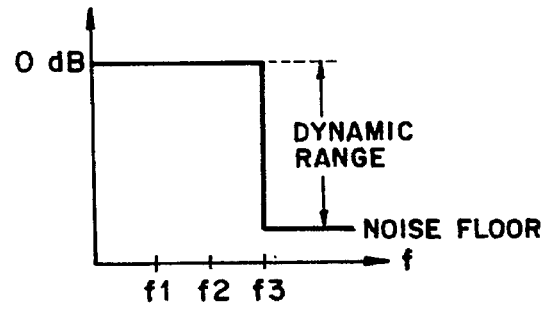

Meanwhile, since a drop of information is prevented by using adjacent coefficients added to each other as a coefficient thinning out method (for example, in the case of ⅓ thinning out, each three adjacent coefficients are added to produce a new coefficient vector), even if the cut-off frequency is varied, no degradation of the dynamic range will be resulted (refer to FIGS. 20(a) and 20(b)).

Figure 23A:
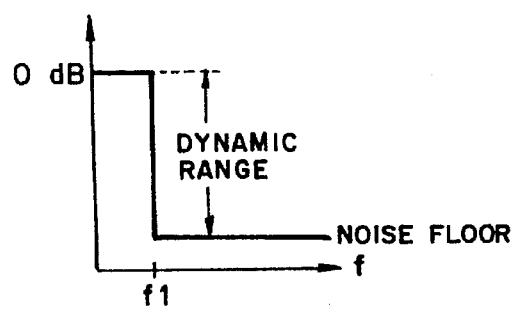
FIGS. 23(a) and 23(b) are diagrams illustrating the basic frequency characteristic and the characteristic after thinning out of coefficients of the decimation filter shown in FIG. 12 in the operations of FIGS. 21 and 22, respectively, for comparison.
Figure 23B:
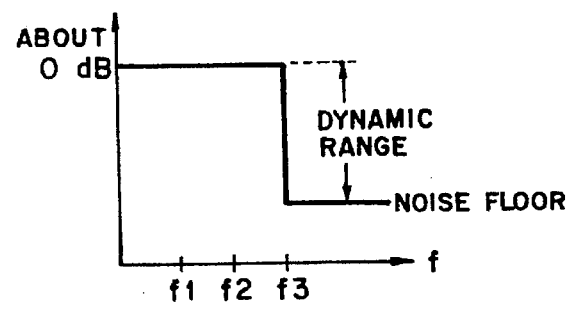

It is to be noted that, although, where a drop of information is prevented by using adjacent coefficients added to each other as a coefficient thinning out method (for example, in the case of ⅓ thinning out, each three adjacent coefficients are added to produce a new coefficient vector), no deterioration of the dynamic range is resulted as described above even if the cut-off frequency is varied, the following technique may be employed instead if variation of the cut-off frequency results in degradation of the dynamic range (refer to FIGS. 23(a) and 23(b)).

In particular, when the cut-off frequency is varied, coefficient vectors are thinned out, and also within a free time produced as a result of such thinning out of coefficient vectors, the same convolution calculation is repeated and a result of the convolution calculation is accumulated. In this instance, the construction of the second digital filter 102 may be similar to that of the second digital filter 102 shown in FIG. 12, and the operation described just above can be achieved only by changing the procedures of the signals P1 and P2 from the pointer means 108.

Here, an example of the output of the pointer means 108 in this instance is listed in Table 2 below where the number of coefficient taps is 9.

TABLE 2

Example of Output of Pointer Means
(when coefficient tap number is 9)

| Thinning Out of Coefficients | | Outputs of Pointer Means | Cut-off Frequency |
|---|---|---|---|
| 1/1 | P1 | 0, 1, 2, 3, 4, 5, 6, 7, 8 | fc |
|  | P2 | 0, 1, 2, 3, 4, 5, 6, 7, 8 |  |
| 1/2 | P1 | 0, 0, 1, 1, 2, 2, 3, 3, — | 2 × fc |
|  | P2 | 0, 0, 2, 2, 4, 4, 6, 6, — |  |
| 1/3 | P1 | 0, 0, 0, 1, 1, 1, 2, 2, 2 | 3 × fc |
|  | P2 | 0, 0, 0, 3, 3, 3, 6, 6, 6 |  |
| 1/4 | P1 | 0, 0, 0, 0, 1, 1, 1, 1, — | 4 × fc |
|  | P2 | 0, 0, 0, 0, 4, 4, 4, 4, — |  |

The filter characteristics at the cut-off frequencies fc, 2xfc, 3xfc and 4x4f listed in Table 2 are illustrated in FIGS. 24(a) to 24(d).

Figure 21:
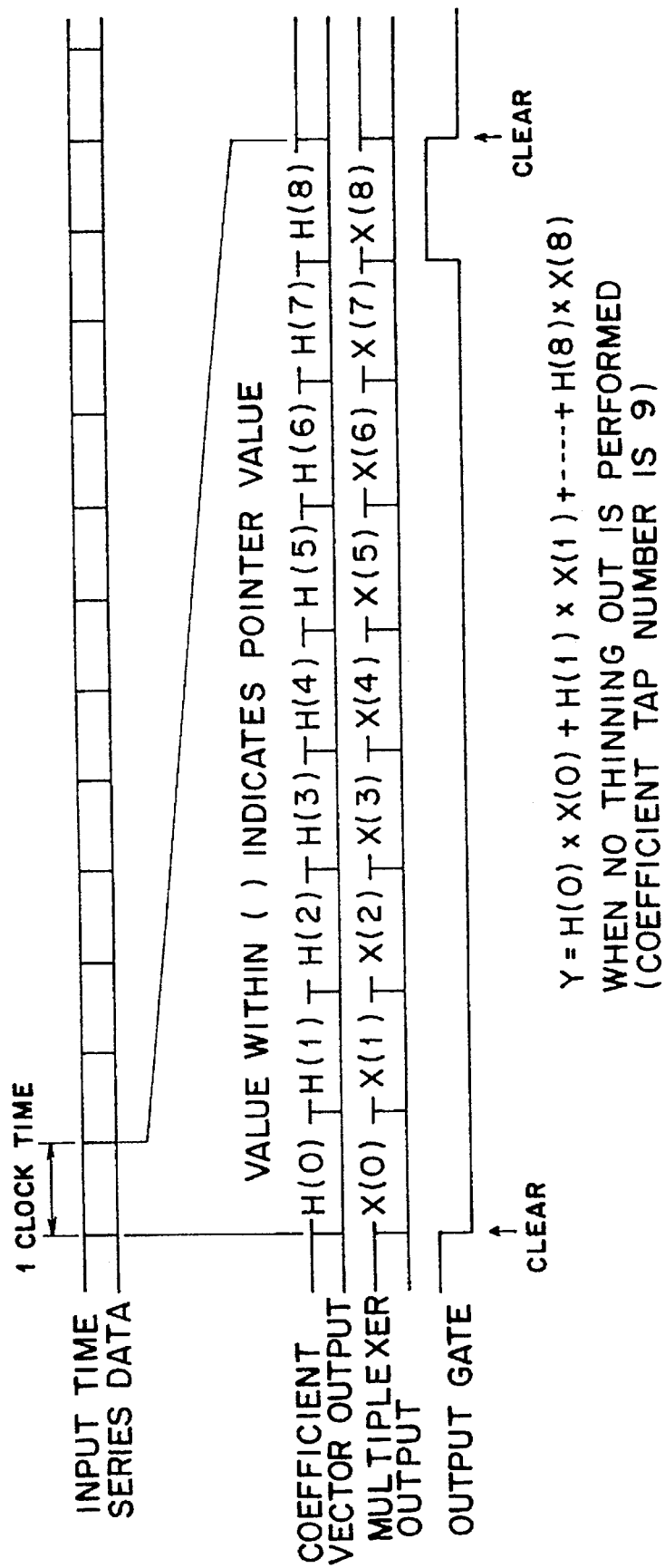

In this instance, the time charts of the coefficient vector output, the multiplexer output (input time series data) and the output gate output of the second digital filter 102 when it does not perform a thinning out operation become such as shown in FIG. 21. Meanwhile, the time charts of the coefficient vector output, the multiplexer output (input time series data) and the output gate output of the second digital filter 102 when it performs a thinning out operation (thinning out to ⅓) become such as shown in FIG. 22.

It is to be noted that, the output Y of the output gate 9 (the output of the second digital filter 102) when thinning out is not performed is given by $$Y = H(0) \times X(0) + H(1) \times X(1) \ldots + H(8) \times X(8)$$

but the output Y of the output gate 9 (the output of the second digital filter 102) when ⅓ thinning out is performed is given by $$Y = 3 \times [H(0) \times X(0) + H(3) \times X(1) + H(6) \times X(2)]$$

From this, it can be seen that the first convolution calculation section 109 repetitively performs the processing of first performing repetitive convolution calculation wherein a same convolution calculation operation is performed once (when no thinning out operation is performed) or successively by a plurality of times (when a thinning out operation is performed) using same coefficient vectors and the same input data and then varying the coefficient vectors and the input data to allow the repetitive convolution calculation to be repeated subsequently. Also it can be seen that the cut-off frequency can be varied by the countermeasure just described.

It is to be noted that, also in this instance, a number of coefficient vectors (tap coefficients) with which the selectable lowest cut-off frequency fc can be realized (in this instance, the number is 9) are set in the coefficient vector setting means 107 in advance, but separate coefficient vector setting means are not provided for the different cut-off frequencies 2xfc, 3xfc and 4xfc. Also this is based on the fact that the filter characteristics at the cut-off frequencies fc, 2xfc, 3xfc and 4xfc and the coefficient vectors have such relationships as illustrated in FIGS. 24(a) to 24(d) and 24(e)

to 24(*h*), that is, the coefficient vectors required for the filter characteristics having the cut-off frequencies other than the lowest cut-off frequency fc are included in the coefficient vector required for the filter characteristic having the lowest cut-off frequency fc. In other words, also in this instance, if a number of coefficient vectors with which the lowest cut-off frequency fc can be realized are prepared, then the filter characteristics at the other cut-off frequencies 2xfc, 3xfc and 4xfc can be realized.

Even with this, by making the control signals P1 and P2 from the pointer means 108 different from each other for the multiplexers 5 and 6, respectively, while using coefficient vectors commonly in this manner, the cut-off frequency can be varied readily, and consequently, a digital filter having a variable cut-off frequency can be manufactured with a simple construction. Also, due to such simple construction, formation into an LSI can be achieved readily. Further, where a digital FIR filter is constituted from an LSI, reduction of the number of gates can be achieved by reduction or simplification of filter banks, a rounding circuit and a control circuit, and as a result, enhancement in efficiency in designing can be achieved.

It is to be noted that, while it is set here that a plurality of cut-off frequencies which have values equal to an integral number of times (2, 3 and 4 times) the lowest cut-off frequency, in this instance, if the number of tap coefficients with which the lowest cut-off frequency can be realized is set to a number which is exactly divisible by a least common multiple (12) of values (2, 3 and 4) obtained by dividing the cut-off frequency values by the lowest cut-off frequency, in this instance, a multiple of 12, then filtering processing by which error is minimized can be achieved.

Meanwhile, for the coefficient thinning out method described above, in addition to the technique of using adjacent coefficients added to each other (for example, in the case of ⅓ thinning out, each three adjacent coefficients are added to produce a new coefficient vector), the technique of thinning out coefficient vectors, repeating the same convolution calculation successively also within a free time produced as a result of such thinning out of coefficient vectors and accumulating a result of the convolution calculation (thinning out coefficient fectors to 1/(thinning out factor) time), the following technique may be employed.

In particular, when the cut-off frequency is varied, only coefficient vectors are thinned out. Also the construction of the second digital filter 102 may be similar to that of the second digital filter 102 shown in FIG. 12, and the operation described just above can be achieved only by changing the procedures of the signals P1 and P2 from the pointer means 108.

The filter characteristics at the cut-off frequencies fc, 2xfc, 3xfc and 4xfc in this instance are illustrated in FIGS. 25(*a*) to 25(*d*), respectively.

The output Y of the output gate 9 (the output of the second digital filter 102) when thinning out is not performed is given by $$Y=H(0)\times X(0)+H(1)\times X(1) \ldots +H(8)\times X(8)$$

but the output Y of the output gate 9 (the output of the second digital filter 102) when, for example, ⅓ thinning out is performed is given by $$Y=[H(0)\times X(0)+H(3)\times X(1)+H(6)\times X(2)]$$

From this, it can be seen that the first convolution calculation section 109 repetitively performs the processing of first performing repetitive convolution calculation wherein a same convolution calculation operation is performed once (when no thinning out operation is performed) or successively by a plurality of times (when a thinning out operation is performed ) using same coefficient vectors and the same input data and then varying the coefficient vectors and the input data to allow the repetitive convolution calculation to be repeated subsequently. Also it can be seen that the cut-off frequency can be varied by the countermeasure just described.

It is to be noted that, also in this instance, a number of coefficient vectors (tap coefficients) with which the selectable lowest cut-off frequency fc can be realized (in this instance, the number is 9) are set in the coefficient vector setting means 107 in advance, but separate coefficient vector setting means are not provided for the different cut-off frequencies 2xfc, 3xfc and 4xfc. Also this is based on the fact that the filter characteristics at the cut-off frequencies fc, 2xfc, 3xfc and 4xfc and the coefficient vectors have such relationships as illustrated in FIGS. 25(*a*) to 25(*d*) and 25(*e*) to 25(*h*), that is, the coefficient vectors required for the filter characteristics having the cut-off frequencies other than the lowest cut-off frequency fc are included in the coefficient vector required for the filter characteristic having the lowest cut-off frequency fc. In other words, also in this instance, if a number of coefficient vectors with which the lowest cut-off frequency fc can be realized are prepared, then the filter characteristics at the other cut-off frequencies 2xfc, 3xfc and 4xfc can be realized.

Even with this, by making the control signals P1 and P2 from the pointer means 108 different from each other for the multiplexers 5 and 6, respectively, while using coefficient vectors commonly in this manner, the cut-off frequency can be varied readily, and consequently, a digital filter having a variable cut-off frequency can be manufactured with a simple construction. Also, due to such simple construction, formation into an LSI can be achieved readily. Further, where a digital FIR filter is constituted from an LSI, reduction of the number of gates can be achieved by reduction or simplification of filter banks, a rounding circuit and a control circuit, and as a result, enhancement in efficiency in designing can be achieved.

It is to be noted that, while it is set also here that a plurality of cut-off frequencies which have values equal to an integral number of times (2, 3 and 4 times) the lowest cut-off frequency, in this instance, if the number of tap coefficients with which the lowest cut-off frequency can be realized is set to a number which is exactly divisible by a least common multiple (12) of values (2, 3 and 4) obtained by dividing the cut-off frequency values by the lowest cut-off frequency, in this instance, a multiple of 12, then filtering processing by which error is minimized can be achieved.

Figure 26:
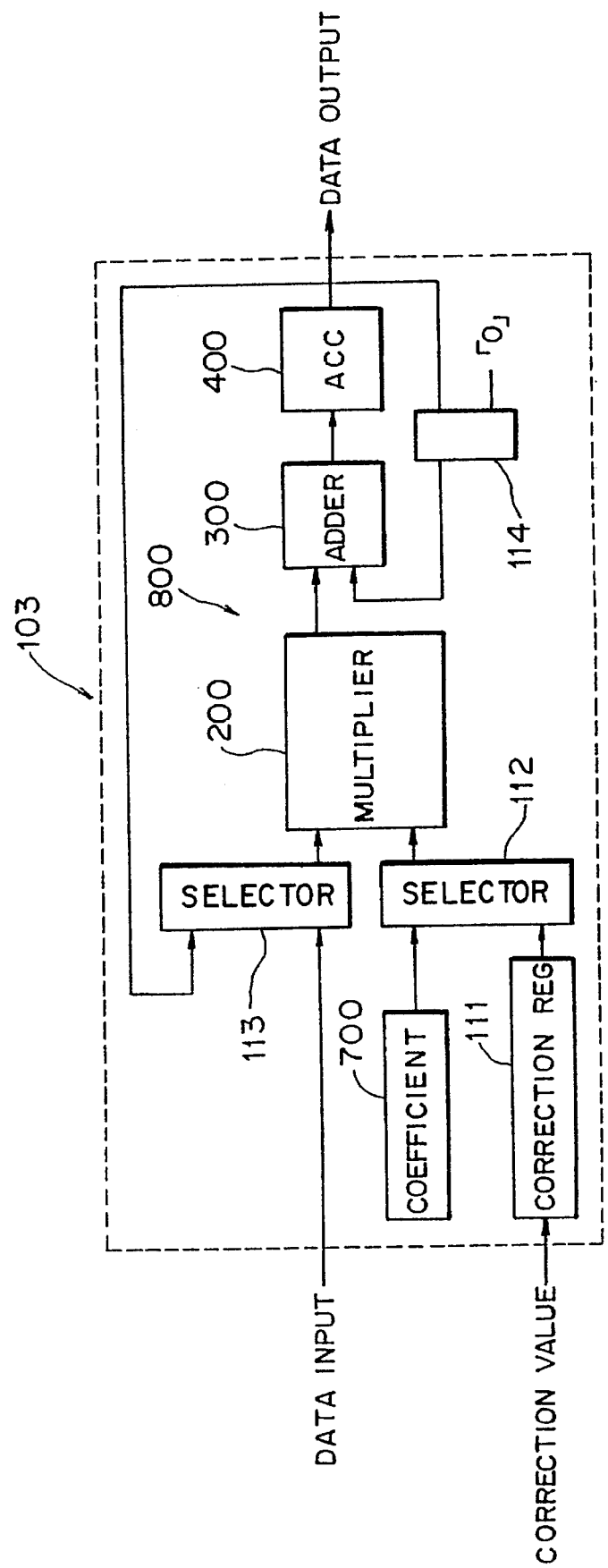
FIG. 26 is a block diagram schematically showing a general construction of another decimation filter to which the present invention is applied.

Subsequently, the third digital filter 103 which can correct the gain error caused by analog to digital conversion will be described in detail. Referring to FIG. 26, the third digital filter 103 includes coefficient vector setting means 700 for setting a coefficient vector, a correction value setting register (REG) (correction value setting means) 111 for setting a correction value to be used for correction of the gain error caused by analog to digital conversion, a multiplier (multiplication means) 200 for multiplying input data by a coefficient vector (tap coefficient) from the coefficient vector setting means 700, an adder (addition means) 300 for adding a result of multiplication by the multiplier 200 to accumulation information, and an accumulator (ACC) (accumulation means) 400 for accumulating a result of addition by the adder 300 as the accumulation information as well as three selectors 112, 113 and 114. Also the third digital filter 103 is formed as an LSI.

The selector (first selector) 112 selectively outputs a tap coefficient from the coefficient vector setting means 700 or a correction value from the correction value setting register 111 to the multiplier 200; the selector 113 selectively outputs input data or the output of the accumulator 400 to the multiplier 200; and the selector (second selector) 114 supplies, when the selector 112 selects a coefficient vector, a result of accumulation by the accumulator 400 to the adder 300 but supplies, when the selector 112 selects a correction value, zero information to the adder 300.

Accordingly, the third digital filter 103 includes coefficient vector setting means (second tap coefficient setting means) 700 for setting a coefficient vector (second tap coefficient), second convolution calculation means 800 for performing convolution calculation using a coefficient vector (second tap coefficient) from the coefficient vector setting means (second tap coefficient setting means) 700 and input data, and a correction value setting register (correction value setting means) 111 for setting a correction value for use to correct the gain error caused by analog to digital conversion by the analog to digital converter 97. The second convolution calculation means 800 is constructed so as to receive correction value from the correction value setting register 111 and perform gain correction using the multiplier 200.

It is to be noted that setting of a correction value to the correction value setting register 111 is performed by sending a correction value by way of the register 99-2 from the MPU in the remote station unit 92.

Figure 28:
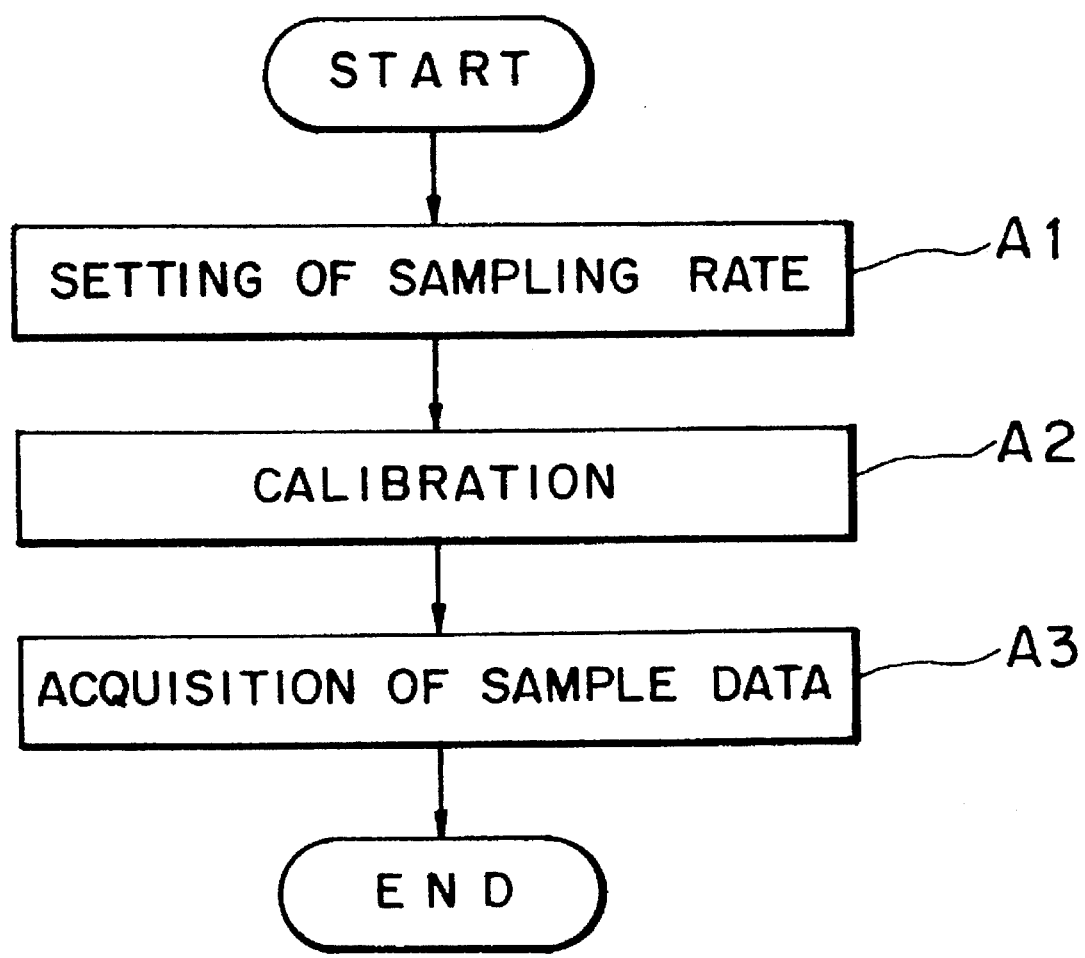
FIGS. 28 and 29 are flow charts illustrating operation of the remote station unit shown in FIG. 10.

Subsequently, the point of acquisition of a correction value will be described with reference to FIGS. 28 and 29. First, a sampling operation is performed in such a procedure as illustrated in FIG. 28. In particular, a sampling rate is set first and then calibration is performed, and thereafter, sample data are acquired (steps A1 to A3).

Figure 29:
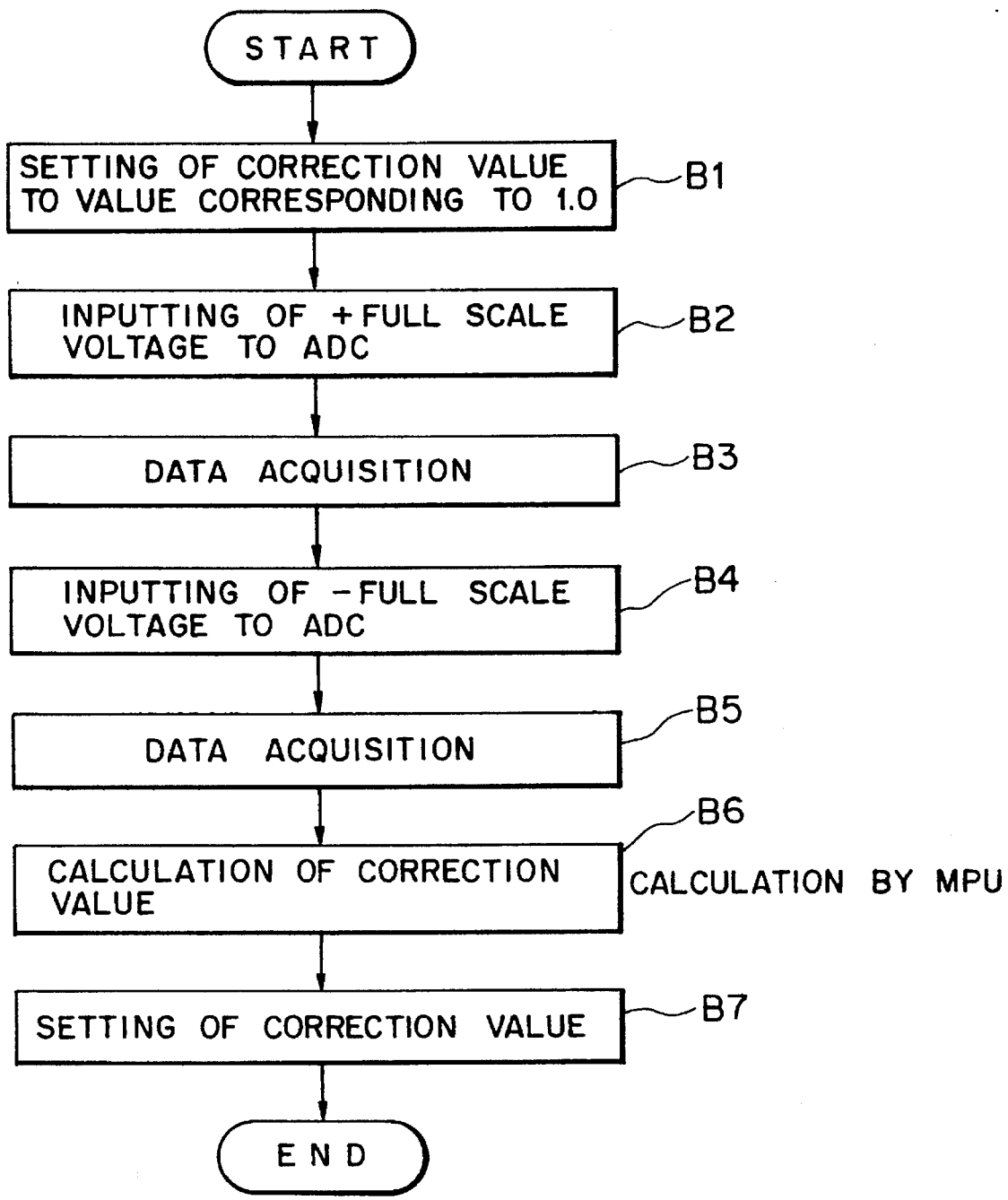

Then, calibration is performed in the procedure illustrated in FIG. 29. In particular, the correction value is set to a value corresponding to 1.0 (step B1). Then, the MPU sends a calibration instruction to the register 99-1 so that the analog switch 95 is switched to the reference power source 100 side. Consequently, the positive (+) full scale voltage (I1) and the negative (−) full scale voltage (I2) from the reference power source 100 are supplied to the analog to digital converter 97. Consequently, data upon application of the full scale voltages are acquired by the MPU by way of the register 99-3 (steps B2 to B5).

Then, the MPU calculates a gain error correction value in accordance with the thus acquired data (step B6), sends the thus calculated correction value to the correction value setting register 111 by way of the register 99-2 and sets the correction value to the correction value setting register 111 (step B7).

In particular, the value of the correction value setting register 111 (initial value of the correction REG) is first set to a value (1.0 in decimal notation) which is not used for correction, and then two arbitrary values (normally the positive full scale value and the negative full scale value; here I1 and I2) are inputted to the input of the filter. Consequently, the two values are processed by filtering processing. From the values O1 and O2 of the filter then, a value given by $$(I2-I1)/(O2-O1) \quad (2)$$

is calculated. The thus calculated value is stored as correction value into the correction value setting register 111.

Thereafter, analog to digital conversion and filtering are started by the oversampling analog to digital converter 96. When the number of taps is N, similar calculation to that of the conventional digital filter is performed up to the Nth calculation cycle, but in the N+1th calculation cycle, multiplication of a result of the calculation up to the Nth calculation cycle by the gain correction value is performed. In this instance, addition between a result of such multiplication and data in the accumulator 400 is not performed. In other words, addition between the result of the multiplication and zero is performed. In this manner, where the number of taps is N, the filtering processing and the gain correction are completed by N product sum calculation operations and one multiplication operation. The states at several locations of the third digital filter 103 are such as illustrated in the time charts of FIGS. 30(a) to 30(e).

Figure 27:
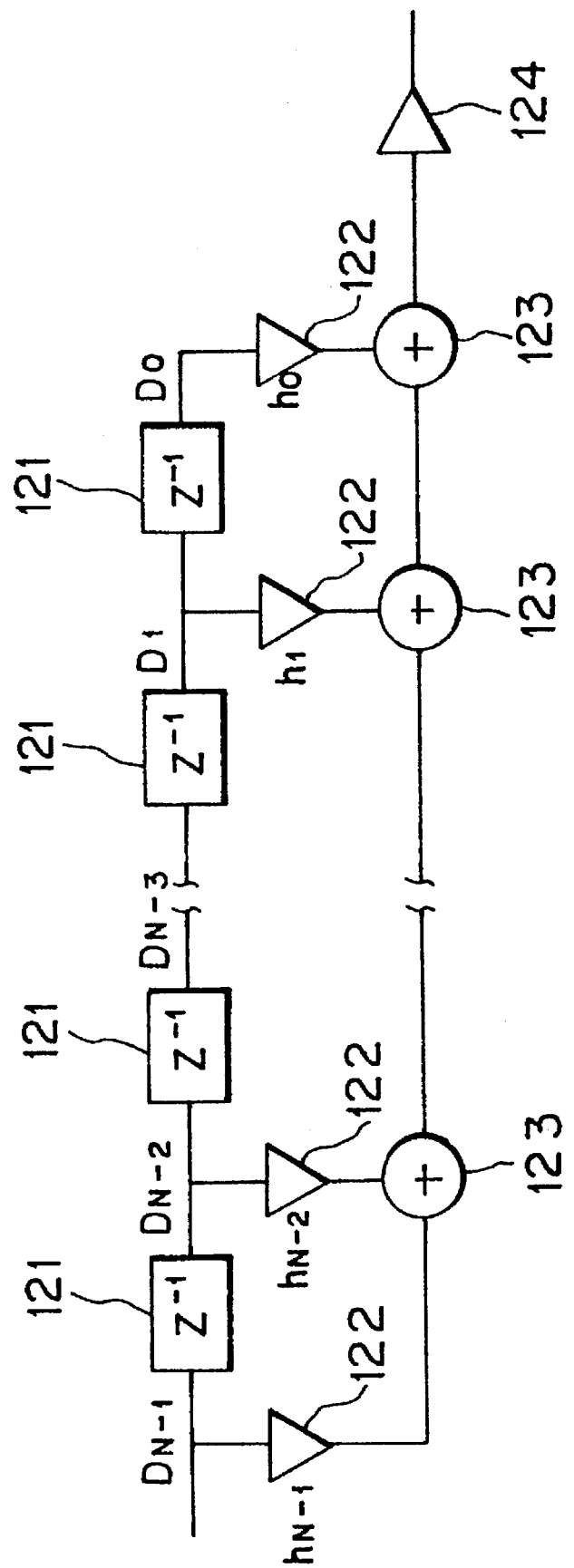
FIG. 27 is a signal block diagram showing the decimation filter of FIG. 26.

The third digital filter 103 is shown in the form of a signal block diagram in FIG. 27. Referring to FIG. 27, the third digital filter 103 is constituted from one-clock time delay circuits 121, coefficient vector multipliers 122, adders 123 and a correction value multiplier 124. From FIG. 27, it can be seen that, in the third digital filter 103, the coefficient vector multipliers 122 and the adders 123 can be used all commonly upon gain correction. And, since this apparently increases the number of taps of the filter by one, multiplication of a finally obtained product sum by the correction value is performed upon calculation of the additional, that is, the last tap calculation.

Figure 31A:
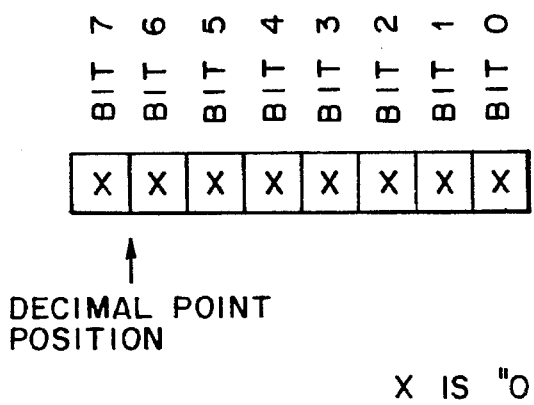
FIGS. 31(a) and 31(b) are diagrammatic views illustrating different arrays of bits of a correction value.

Further, while correction calculation in the present embodiment is performed using the multiplier 200 in the digital filter, if, for example, the correction value is constituted from 8 bits and a multiplier which performs calculation of 8 bits×8 bits is employed, then where a multiplier for a non-negative value is used for the multiplier 200, the correction value of 8 bits is considered a decimal number of a fixed point having an integral part at the uppermost bit of the correction value as seen from FIG. 31(a). In this instance, a result of multiplication between data for which correction should be performed and the correction value is obtained by shifting the position of the decimal point by seven bits leftwardly.

Figure 31B:
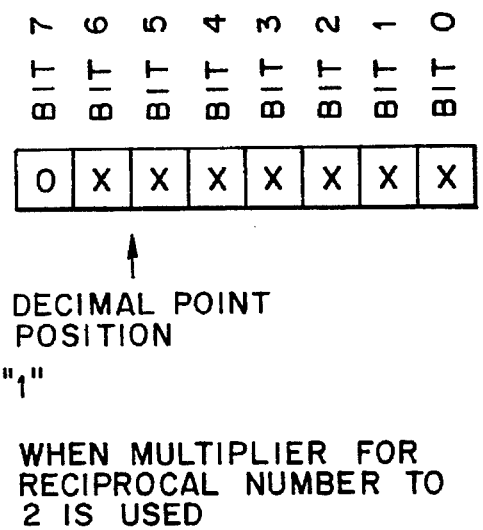

On the other hand, where a multiplier for a complementary number to 2 is used for the multiplier 200, the correction value of 8 bits is considered a decimal number of a fixed point having a value "0" at the uppermost bit of the correction value and having an integral part at the next bit as seen from FIG. 31(b). It is to be noted that a result of multiplication between data for which correction should be performed and the correction value is obtained by shifting the position of the decimal point of the correction value by 6 bits leftwardly.

In either case, the 8-bit correction value is a value higher than 0 but lower than 2. Examples of those values are listed as values of the expression (1), values of reciprocal numbers to the values of the expression (1) and binary notation of the values of the reciprocal numbers to the values of the expression (1) in Table 3 below.

TABLE 3

| Example of Correction Value Representations (in 8-bits) | | | |
|---|---|---|---|
| Value by Expression (1) (decimal) | Correction Value (by Expression (2)) Reciprocal to Expression (1) (decimal) | Binary Notation of Correction Value Non-Negative Multiplier Used | Binary Notation of Correction Value Multiplier for Complement to 2 Used |
| 1.1428571 | 0.8750000 | 01110000 | 00111000 |

TABLE 3-continued

| | | | |
|---|---|---|---|
| 1.0322581 | 0.9687499 | 01111011 | 00111101 |
| 1.0078740 | 0.9921875 | 01111111 | 00111111 |
| 1.0000000 | 1.0000000 | 10000000 | 01000000 |
| 0.9846153 | 1.0156251 | 10000010 | 01000001 |
| 0.8951048 | 1.1171876 | 10001111 | 01000111 |
| 0.8648648 | 1.1562501 | 10010100 | 01001010 |

If the construction shown in FIGS. 26 and 27 is employed using such a correction value as described above, a multiplier in the digital filter can be used for calculation for gain correction after filtering processing is performed. Consequently, gain correction can be performed within the digital filter, and there is no need of provision of a special circuit outside the digital filter any more.

This allows correction by means of a multiplier but not by means of a divider as in the prior art, and further, a digital filter having a gain correction function can be realized by performing multiplication for correction by means of a multiplier in a digital filter. Consequently, the necessity for an external circuit for gain correction is eliminated. Further, it is also easy to form the digital filter into an LSI.

Due to the construction described above, a detection signal (analog signal) from a geophone 93 is converted into a digital signal by analog to digital conversion by the remote station unit 92 and then sent to the central recording unit 91. In the central recording unit 91, such digital acquisition data from the individual remote station units 92 are processed by suitable processing to effect recording processing of data into the memory.

Further, in the remote station unit 92, thinning out processing is performed by the decimation filter 98 after the analog to digital conversion is performed by the analog to digital conversion section 97 of the oversampling analog to digital converter 96. In this instance, the first convolution calculation means 109 of the second digital filter 102 of the decimation filter 98 performs, in order to achieve variation of the cut-off frequency, such processing as to repetitively perform the processing of first performing repetitive convolution calculation wherein a same convolution calculation operation is performed once or successively by a plurality of times using same tap coefficients and the same input data and then varying the coefficient vectors (first tap coefficients) or the input data to allow the repetitive convolution calculation to be repeated subsequently, and the second convolution calculation means 800 of the third digital filter section 103 at the succeeding stage to the second digital filter section 102 receives a correction value from the correction value setting register 111 and performs gain correction using the multiplier 200.

Then, in order for the second digital filter section 102 to vary the cut-off frequency, only it is required to make the control signals P1 and P2 from the pointer means 108 different from each other for the multiplexers 5 and 6, respectively, while using coefficient vectors commonly. Accordingly, a digital filter of the variable cut-off frequency type can be manufactured with a simple construction. Further, such simple construction facilitates formation of the digital filter into an LSI, and such formation of the digital filter as an LSI contributes very much to down-sizing comparing with the alternative case wherein the digital filter is formed from a digital signal processor. In particular, where a digital FIR filter is constituted from an LSI, reduction of the number of gates can be achieved by reduction or simplification of filter banks, a rounding circuit and a control circuit, and as a result, enhancement in efficiency in designing can be achieved.

Further, in the present embodiment, since a conventional gain correction value is improved to allow correction by means of a multiplier and besides multiplication for correction is performed by means of a multiplier in a digital filter, a digital filter having a gain correction function can be realized, and consequently, the necessity for an external circuit for gain correction is eliminated.

It is to be noted that, while, in the embodiment described above, the decimation filter 98 of the oversampling analog to digital converter has a cut-off frequency variation function and a gain correction function, the following modifications can be made.

Figure 37:
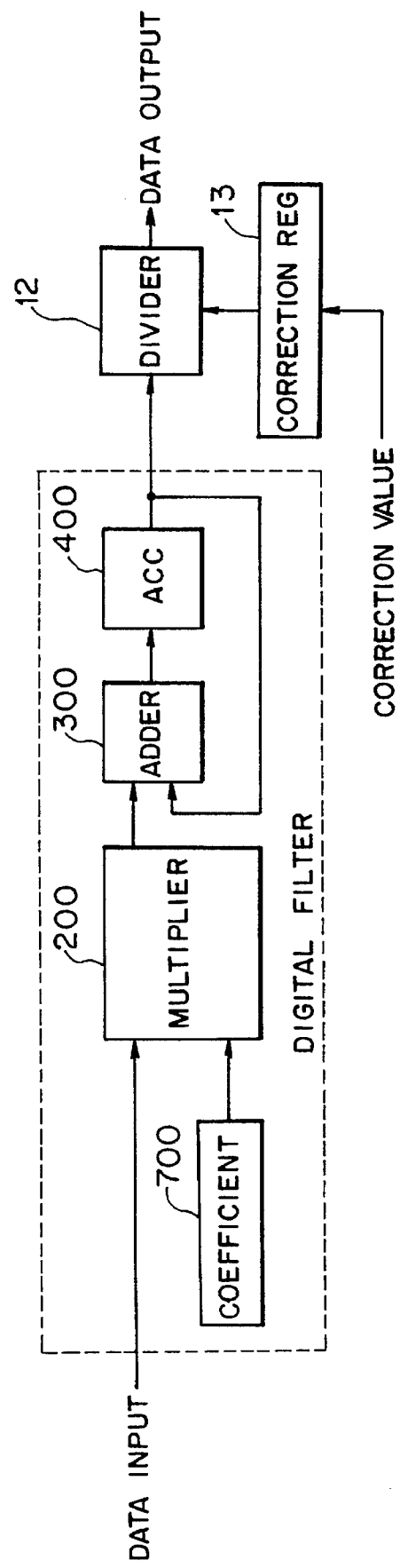
FIG. 37 is a block diagram showing an exemplary circuit construction for correction of a gain.

1. The function of using coefficient vectors commonly to vary the cut-off frequency (for the construction therefor, refer to FIG. 12) is provided only to the second digital filter section 102 of the decimation filter 98 while the third digital filter section 103 has a conventional gain correction function (a divider is necessitated as an external circuit for gain correction, refer to the apparatus of the construction shown in FIG. 37). With the modified construction, at least the effects obtained by provision of the function of using coefficient vectors commonly to vary the cut-off frequency, that is, simplification in construction, facilitation in formation into an LSI and facilitation of down-sizing, are achieved.

Figure 35:
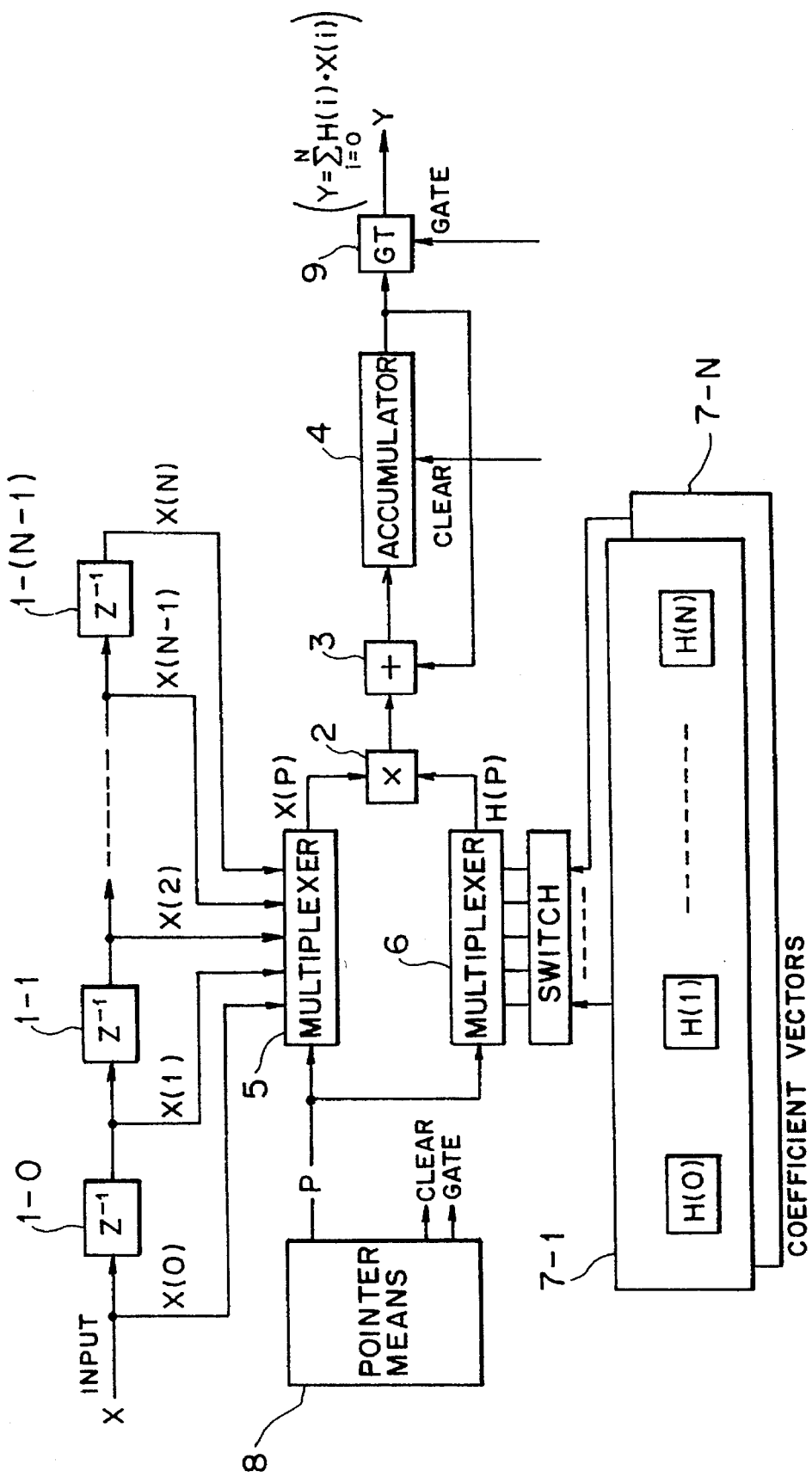
FIG. 35 is a block diagram of another digital filter of the FIR type.
Figure 36:
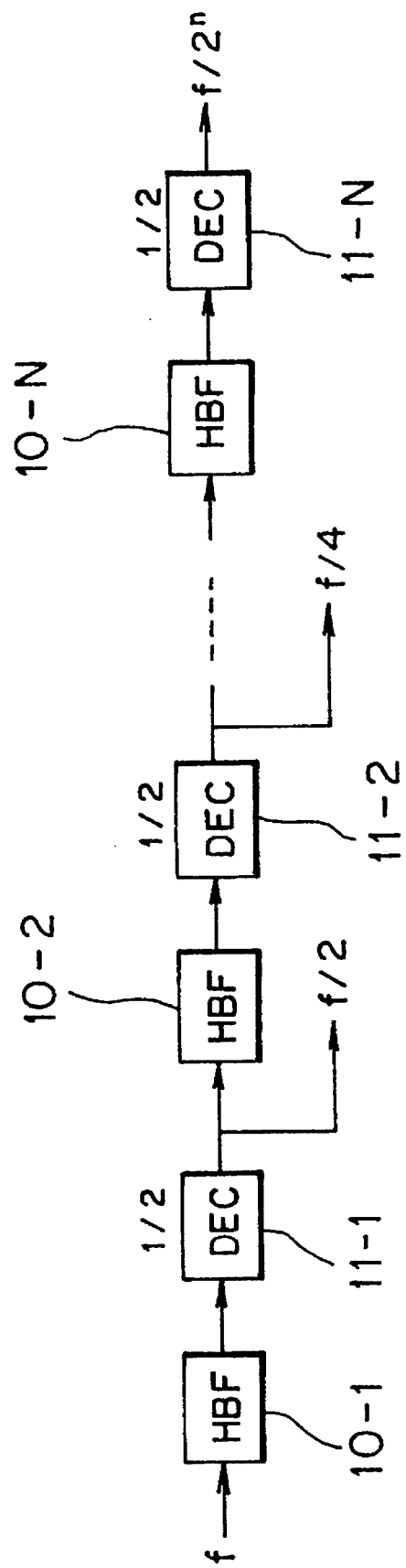
FIG. 36 is a block diagram illustrating an example of decimation.

2. The gain correction function using the multiplication function in the filter (for the construction therefor, refer to FIGS. 26 and 27) is provided only to the third digital filter section 103 in the decimation filter 98 while the second digital filter section 102 has coefficient vector data for the individual cut-off frequencies and uses corresponding coefficient vector data upon variation of the cut-off frequency (refer to FIG. 35). With the modified construction, at least the effects achieved by provision of the gain correction function using the multiplication means in the filter, that is, elimination of the necessity for an external circuit and so forth, are achieved.

Figure 32:
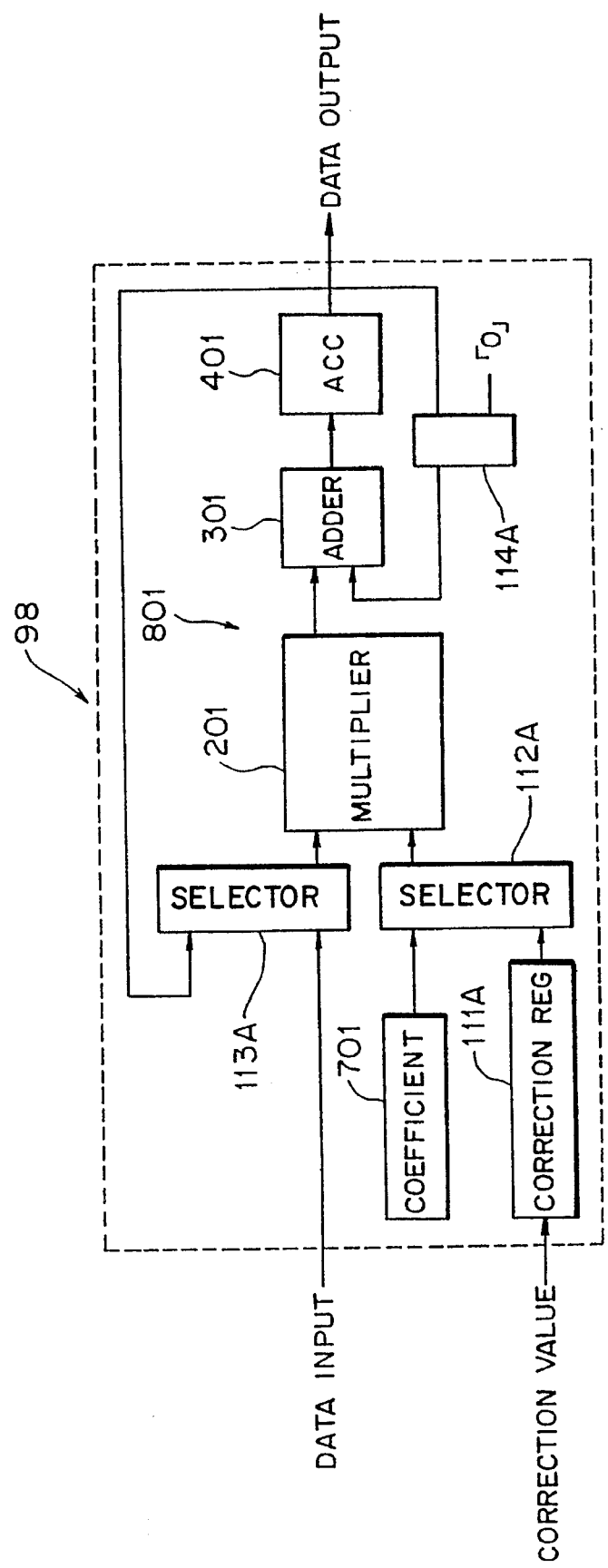
FIG. 32 is a block diagram schematically showing a general construction of a further decimation filter to which the present invention is applied.
Figure 33:
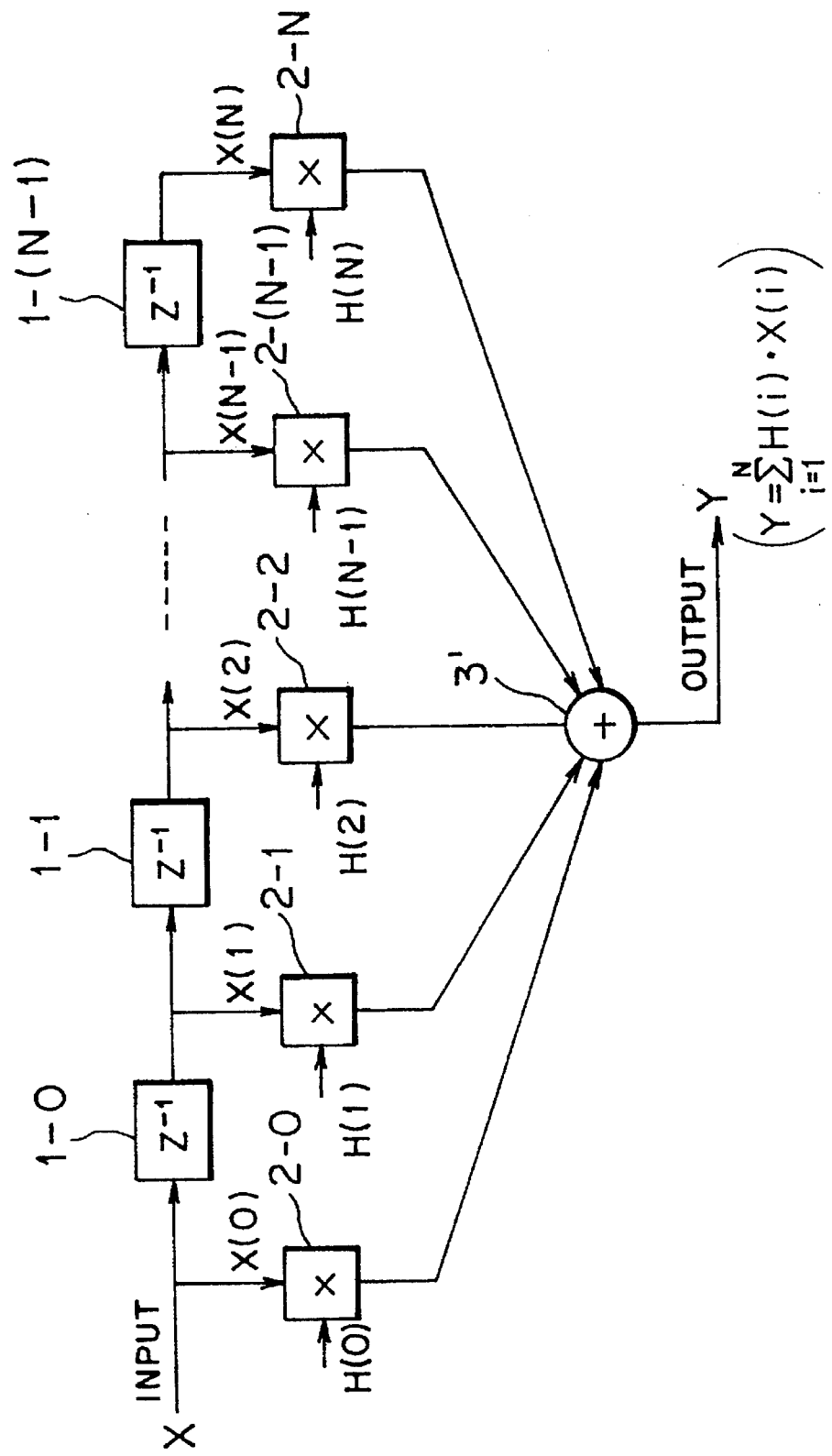
FIG. 33 is a model diagram of a digital filter of the FIR type.
Figure 34:
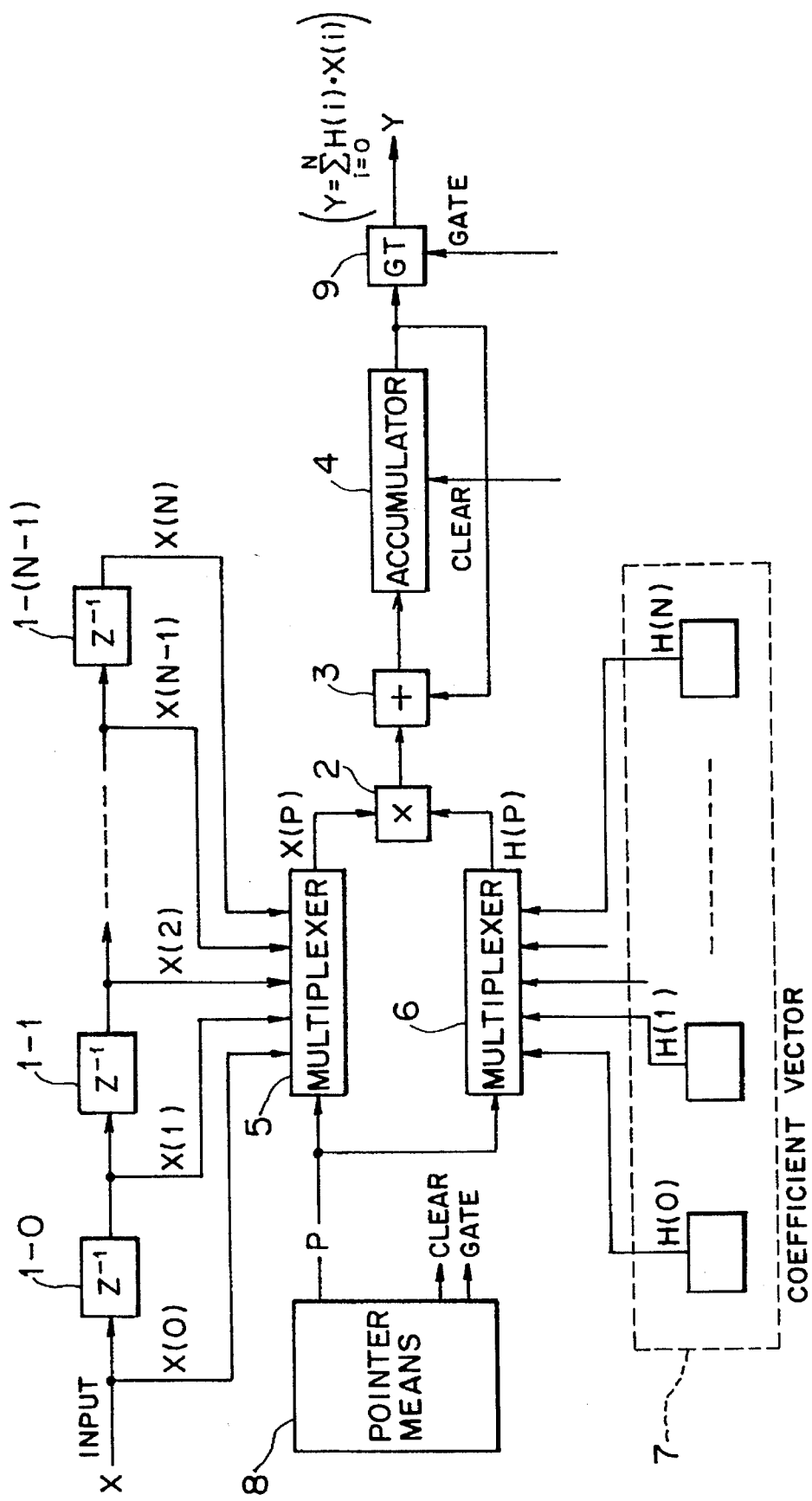
FIG. 34 is a block diagram of the digital filter of the FIR type of FIG. 33.

Further, while, in the embodiment described above, the decimation filter 98 of the oversampling analog to digital converter is constituted divisionally from the plurality of digital filters 101 to 103 and one of the digital filters 101 to 103, that is, the second filter section 102, has the cut-off frequency variation function while the gain correction function is provided to the third filter section 103, if an increase of the number of taps does not matter, then the cut-off frequency variation function and the gain correction function can be provided to a single digital filter from which the decimation filter 98 is formed. An example of the construction in this instance is shown in FIG. 32. In particular, in this instance, the decimation filter 98 includes coefficient vector setting means (tap coefficient setting means) 701 for setting a coefficient vector (tap coefficient) and convolution calculation means 801 including a multiplier 201, an adder 301, an accumulator (ACC) 401 and selectors 112A, 113A and 114A for performing convolution calculation using a coefficient vector from the coefficient vector setting means 701 and input data, as well as correction value setting means (correction REG) 111A for setting a correction value to be used for correction of the gain error caused by analog to digital conversion. The convolution calculation means 801 is constructed, in order to achieve variation of the cut-off frequency, so as to repetitively perform the processing of first performing repetitive convolution calculation wherein a same convolution calculation operation is performed once or successively by a plurality of times using same tap coefficients or the same input data and then varying the tap coefficients and the input data to allow the repetitive convolution calculation to be repeated subsequently and so as to receive a correction value from the correction value setting means 111A and perform gain correction using the multiplier 201. Consequently, the effects obtained by provision of the function of using coefficient vectors commonly to vary the cut-off frequency, that is, simplification in construction, facilitation in formation into an LSI and facilitation of down-sizing, are achieved, and besides, the effects achieved by provision of the gain correction function using the multiplication means in the filter, that is, elimination of the necessity for an external circuit and so forth, are obtained.

Figure 12:
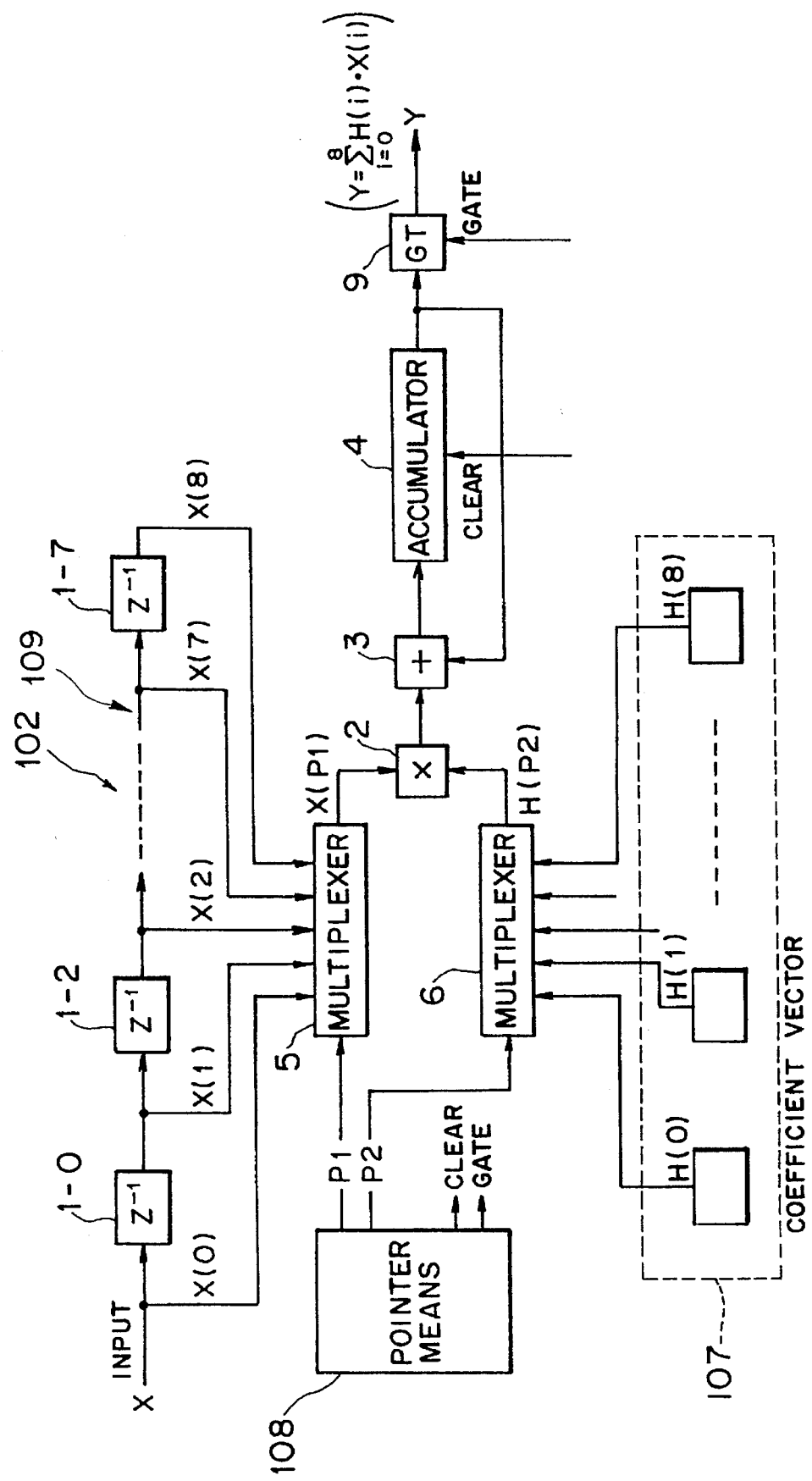
FIG. 12 is a block diagram schematically showing a detailed construction of the decimation filter shown in FIG. 11.

Further, in the present invention, while the cut-off frequency variation function and the gain correction function may be provided to a digital filter used in a decimation filter of an oversampling analog to digital converter as in the embodiment described above, alternatively they may be provided to another digital filter which is used for another application. In this instance, the digital filter may have only the function of using coefficient vectors commonly to vary the cut-off frequency or alternatively may have only the function of performing gain correction using the multiplication means in the filter or may otherwise have both functions. It is to be noted that, where the digital filter has the function of performing gain correction using multiplication means in the filter, the present invention can be applied not only to a digital filter of the FIR type but also to a digital filter of the IIR type.

Where the digital filter has only the function of using coefficient vectors commonly to vary the cut-off frequency, it has such a construction as shown in FIG. 12. Due to the construction shown in FIG. 12, the effects of simplification in construction, facilitation in formation into an LSI and facilitation in down-sizing can be achieved.

Further, where the digital filter has the function of performing gain correction using multiplication means in the filter, it has such a construction as shown in FIGS. 26 and 27, and such construction allows achievement of the effects of elimination of an external circuit and so forth.

Further, where the digital filter has the two functions, it has such a construction as shown in FIG. 32, and such construction allows achievement of the effects of simplification in construction, facilitation in formation into an LSI and facilitation in down-sizing as well as elimination of the necessity for an external circuit.

The present invention is not limited to the specifically described embodiment, and variations and modifications may be made without departing from the scope of the present invention.

What is claimed is:

1. A digital filter, comprising:

tap coefficient setting means for setting a single set of tap coefficients; and convolution calculation means for performing convolution calculation using the single set of tap coefficients from said tap coefficient setting means and input data;

said convolution calculation means being constructed, in order to allow variation of the cut-off frequency of said digital filter, to repetitively perform the processing of first performing repetitive convolution calculation wherein a same convolution calculation operation is performed once or successively by a plurality of times using same tap coefficients of the single set of tap coefficients or same input data and then varying the tap coefficient or the input data to allow the repetitive convolution calculation to be repeated.

2. A digital filter as claimed in claim 1, further comprising pointer means for controlling so that elements of the single set of tap coefficients are supplied successively or while being thinned out to said convolution calculation means.

3. A digital filter as claimed in claim 1, wherein said tap coefficient setting means has a single set of tap coefficients set in advance therein with which a selectable lowest cut-off frequency is realized.

4. A digital filter for use with an apparatus which requires correction of a gain error caused by analog to digital conversion, comprising:

tap coefficient setting means for setting a tap coefficient;

convolution calculation means for performing convolution calculation using the tap coefficient from said tap coefficient setting means and input data; and correction value setting means for setting a correction value with which correction of the gain error is performed;

said convolution calculation means including multiplication means by which gain correction IS o performed using the correction value received from said correction value setting means.

5. A digital filter as claimed in claim 4, wherein said convolution calculation means includes, in addition to said multiplication means which performs multiplication calculation between the tap coefficient from said tap coefficient setting means and the input data, addition means for adding a result of the multiplication by said multiplication means to accumulation information, accumulation means for accumulating a result of the addition by said addition means as the accumulation information, a first selector for selectively outputting the tap coefficient from said tap coefficient setting means or the correction value from said correction value setting means to said multiplication means, and a second selector for supplying a result of the accumulation by said accumulation means to said addition means when said first selector selects the tap coefficient but supplying zero information to said addition means when said first selector selects the correction value.

6. A digital filter, comprising:

a first digital filter section including first tap coefficient setting means for setting a first tap coefficient and first convolution calculation means for performing convolution calculation using the first tap coefficient from said first tap coefficient setting means and input data, said first convolution calculation means being constructed, in order to allow variation of the cut-off frequency of said digital filter, so as to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently; and a second digital filter section provided at a following stage to said first digital filter section and including second tap coefficient setting means for setting a second tap coefficient, second convolution calculation means for performing convolution calculation using the second tap coefficient from said second tap coefficient setting means and the input data, and correction value setting means for setting a correction value with which correction of a gain error is performed, said second convolution calculation means performing gain correction by means of multiplication means using the correction value received from said correction value setting means.

7. A digital filter, comprising:

tap coefficient setting means for setting a tap coefficient;

convolution calculation means for performing convolution calculation using the tap coefficient from said tap coefficient setting means and input data; and correction value setting means for setting a correction value with which correction of a gain error is performed;

said convolution calculation means being constructed, in order to allow variation of the cut-off frequency of said digital filter, so as to repetitively perform the processing of first performing repetitive convolution calculation wherein a same convolution calculation operation is performed once or successively by a plurality of times using same tap coefficients or same input data and then varying the tap coefficient or the input data to allow the repetitive convolution calculation to be repeated subsequently;

said convolution calculation means performing gain correction by means of multiplication means using the correction value received from said correction value setting means.

8. An oversampling analog to digital converter employing a digital filter, comprising:

an analog to digital conversion section; and a decimation filter provided at a following stage to said analog to digital conversion section;

said decimation filter being constructed as a digital filter which includes tap coefficient setting means for setting a single set of tap coefficients and convolution calculation means for performing convolution calculation using the single set of tap coefficients from said tap coefficient setting means and input data, said convolution calculation means being constructed, in order to allow variation of the cut-off frequency of said decimation filter, to repetitively perform the processing of first performing repetitive convolution calculation wherein a same convolution calculation operation is performed once or successively by a plurality of times using same tap coefficients of the single set of tap coefficients or same input data and then varying the tap coefficient or the input data to allow the repetitive convolution calculation to be repeated.

9. An oversampling analog to digital converter employing a digital filter, comprising:

an analog to digital conversion section; and a decimation filter provided at a following stage to said analog to digital conversion section;

said decimation filter being constructed as a digital filter which includes tap coefficient setting means for setting a tap coefficient, convolution calculation means for performing convolution calculation using the tap coefficient from said tap coefficient setting means and input data, and correction value setting means for setting a correction value with which correction of a gain error caused by analog to digital conversion by said analog to digital conversion section should be performed, said convolution calculation means being constructed so as to perform gain correction by means of multiplication means using the correction value received from said correction value setting means.

10. An oversampling analog to digital converter, comprising:

an analog to digital conversion section; and a decimation filter provided at a following state to said analog to digital conversion section;

said decimation filter including a plurality of decimation filter sections;

a first one of said decimation filter sections including first tap coefficient setting means for setting a first tap coefficient and first convolution calculation means for performing convolution calculation using the first tap coefficient from said first tap coefficient setting means and input data, said first convolution calculation means being constructed, in order to allow variation of the cut-off frequency of said decimation filter, to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently; and a second one of filter sections said decimation which is provided at a to said first following stage decimation filter section including second tap coefficient setting means for setting a second tap coefficient, second convolution calculation means for performing convolution calculation using the second tap coefficient from said second tap coefficient setting means and the input data, and correction value setting means for setting a correction value with which correction of a gain error caused by analog to digital conversion by said analog to digital conversion section is performed, said second convolution calculation means performing gain correction by means of multiplication means using the correction value received from said correction value setting means.

11. An oversampling analog to digital converter employing a digital filter, comprising:

an analog to digital conversion section; and a decimation filter provided at a following stage to said analog to digital conversion section;

said decimation filter being constructed as a digital filter which includes tap coefficient setting means for setting a tap coefficient, convolution calculation means for performing convolution calculation using the tap coefficient from said tap coefficient setting means and input data, and correction value setting means for setting a correction value with which correction of a gain error is performed, said convolution calculation means being constructed, in order to allow variation of the cut-off frequency of said decimation filter, to repetitively perform the processing of first performing repetitive convolution calculation wherein a same convolution calculation operation is performed once or successively by a plurality of times using same tap coefficients or same input data and then varying the first tap coefficient or the input data to allow the repetitive convolution calculation to be repeated subsequently and to perform gain correction by means of multiplication means using the correction value received from said correction value setting means.

* * * * *